(12) United States Patent
Wada et al.

(10) Patent No.: US 8,116,415 B2
(45) Date of Patent: Feb. 14, 2012

(54) SEMICONDUCTOR INTEGRATED CIRCUIT, COMMUNICATION APPARATUS, INFORMATION PLAYBACK APPARATUS, IMAGE DISPLAY APPARATUS, ELECTRONIC APPARATUS, ELECTRONIC CONTROL APPARATUS AND MOBILE APPARATUS

(75) Inventors: Toru Wada, Osaka (JP); Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 716 days.

(21) Appl. No.: 12/237,814

(22) Filed: Sep. 25, 2008

(65) Prior Publication Data

US 2009/0085616 A1    Apr. 2, 2009

(30) Foreign Application Priority Data

Oct. 2, 2007  (JP) ................................. 2007-258478
Jul. 9, 2008   (JP) ................................. 2008-179233

(51) Int. Cl.
*H04L 7/00*   (2006.01)

(52) U.S. Cl. ........ 375/355; 375/354; 375/295; 375/260; 375/371; 710/61; 710/71

(58) Field of Classification Search ................ 375/371, 375/260, 355, 354, 295; 327/117, 156; 710/61, 710/71
See application file for complete search history.

(56) References Cited

U.S. PATENT DOCUMENTS

| 5,483,553 | A  | * | 1/1996  | Shigetome et al. | ........... 375/256 |
|-----------|----|---|---------|------------------|---------------------|
| 5,757,807 | A  |   | 5/1998  | Tezuka et al.    |                     |
| 5,825,820 | A  | * | 10/1998 | Urabe et al.     | ................... 375/259 |
| 5,966,409 | A  | * | 10/1999 | Maeda et al.     | ................... 375/295 |
| 6,463,108 | B1 | * | 10/2002 | Shakiba          | ........................ 375/345 |
| 7,269,225 | B2 | * | 9/2007  | Shiozawa et al.  | ............. 375/260 |
| 2005/0111572 | A1 |   | 5/2005  | Kuroda et al.    |                     |
| 2005/0174153 | A1 |   | 8/2005  | Saeki            |                     |
| 2008/0238503 | A1 | * | 10/2008 | Mansuri et al.   | ................ 327/156 |
| 2011/0057690 | A1 | * | 3/2011  | Akita            | ............................ 327/144 |

FOREIGN PATENT DOCUMENTS

JP    2000-347993    12/2000
JP    2001-195354    7/2001

* cited by examiner

*Primary Examiner* — Eva Puente
(74) *Attorney, Agent, or Firm* — McDermott Will & Emery LLP

(57) ABSTRACT

The semiconductor integrated circuit having a transmitter circuit for transmitting a supplied external data signal DIN. The transmitter circuit includes: a transmitter flip-flop circuit having a reference clock CK as an input for holding the external data signal DIN in synchronization with the reference clock CK; a frequency divider circuit for multiplying the frequency of the reference clock CK by n/m (m and n are integers equal to or more than 2 and m>n); a data signal buffer circuit for transmitting a data signal held by the transmitter flipflop circuit; and a clock buffer circuit for transmitting the output of the frequency divider circuit.

10 Claims, 21 Drawing Sheets

SEMICONDUCTOR INTEGRATED CIRCUIT, COMMUNICATION APPARATUS, INFORMATION PLAYBACK APPARATUS, IMAGE DISPLAY APPARATUS, ELECTRONIC APPARATUS, ELECTRONIC CONTROL APPARATUS AND MOBILE APPARATUS

BACKGROUND OF THE INVENTION

1. Field of the Invention

The present invention relates to a semiconductor integrated circuit for transmitting a data signal from a core on the transmitter side to a core on the receiver side inside a fine-process adopted LSI.

2. Description of the Prior Art

Conventionally, when a data signal is transmitted from a core (circuit) on the transmitter side to a core (circuit) on the receiver side inside an LSI, a clock is distributed from the same source point to both the transmitter-side core and the receiver-side core to allow flipflops (FFs) in the transmitter-side and receiver-side cores to operate synchronously. This operation scheme however has a problem as follows when the operation is made at high speed with a clock frequency of several GHz or more. That is, a data signal will not be transmitted correctly if the sum of the delay time of the FF in the transmitter-side core, the wiring delay time between the cores and the setup time of the FF in the receiver-side core fails to be equal to or less than the period of one cycle of the clock.

To solve the above problem, disclosed is a semiconductor integrated circuit in which a transmitter-side LSI transmits a source clock simultaneously with data via the same transmission line, and a receiver-side LSI samples the data with the source clock and then synchronizes the sampled data with a clock in the receiver-side LSI, to thereby suppress variations in the delay time of the transmission line and occurrence of clock skew (see Japanese Laid-Open Publication No. 2000-347993, for example, which is hereinafter referred to as Patent Document 1)

As another example, a semiconductor integrated circuit as follows is disclosed (see Japanese Laid-Open Publication No. 2001-195354, for example, which is hereinafter referred to as Patent Document 2). This semiconductor integrated circuit has a transmission line provided between a transmitter-side LSI and a receiver-side LSI for simultaneous transmission of a plurality of data units and a clock. The semiconductor integrated circuit also has a sampling means for sampling data transmitted via the transmission line with the clock transmitted via the transmission line. The sampled data is synchronized with the system clock in the receiver-side LSI.

However, the conventional technique disclosed in Patent Document 1 has the following problem. When a data signal is transmitted at high speed in a fine-process adopted semiconductor integrated circuit, it is difficult to secure the eye pattern of the signal.

For example, as the process is made finer, the transistor gate length becomes smaller and as a result the signal wiring length in a block becomes shorter. Therefore, although the sheet resistance and coupling capacitance of a fine layer used for wiring in the block increase, the performance can be maintained. However, since the total number of hard macros and processors mounted in an LSI increases, the chip area of the LSI becomes roughly the same as the area of a conventional LSI that is not designed under the fine process technology. As a result, the wiring length of transmission lines is roughly the same as that in the fine-process unadopted LSI. Hence, the parasitic resistance and capacitance values increase, reducing the eye pattern.

In other words, the resistance and capacitance of transmission lines increase along with the process becoming finer. therefore, if a signal is transmitted on an on-chip transmission line at further high speed in the conventional scheme, the eye pattern of the traveling signal will no more be secured.

In particular, since the transfer rate of a clock is generally twice as high as the transfer rate of a data signal, the maximum transfer rate will be restricted with the transfer rate of the clock. Also, in the technique disclosed in Patent Document 2, in which the sampled data must be synchronized with the system clock in the receiver-side LSI, it is necessary to distribute the system clock to the receiver-side LSI. This increases the area and power of the semiconductor integrated circuit.

SUMMARY OF THE INVENTION

An object of the present invention is providing a semiconductor integrated circuit in which transmission at a transfer rate higher than the conventional one can be attained with a transmission line having the same structure as the conventional one To attain the above object, according to a first aspect of the present invention, a semiconductor integrated circuit having a transmitter circuit for transmitting a supplied external data signal is provided. The transmitter circuit includes:

a transmitter flipflop circuit having a reference clock as an input for holding the external data signal in synchronization with the reference clock;

a frequency divider circuit for multiplying the frequency of the reference clock by n/m (m and n are integers equal to or more than 2 and m>n);

a data signal buffer circuit for transmitting a data signal held by the transmitter flipflop circuit; and a clock buffer circuit for transmitting the output of the frequency divider circuit.

With the above configuration, the clock can be transmitted with its frequency n/m times as low as the frequency of the reference clock. Hence, transmission at a transfer rate higher than the conventional one can be attained with a transmission line of the same structure as the conventional one.

According to a second aspect of the invention, a semiconductor integrated circuit having a receiver circuit for receiving an external data signal is provided. The receiver circuit includes:

a data signal amplifier circuit for amplifying the external data signal:

a clock amplifier circuit having a reference clock as an input for amplifying the reference clock:

a receiver DLL circuit for multiplying the frequency of the output of the clock amplifier circuit by m/n (m and n are integers equal to or more than 2 and m>n); and a receiver flipflop circuit for holding the output of the data signal amplifier circuit in synchronization with the output of the receiver DLL circuit.

With the above configuration, the frequency of the external clock can be multiplied by m/n in the receiver DLL circuit. Hence, transmission at a transfer rate higher than the conventional one can be attained with a transmission line of the same structure as the conventional one.

According to a third aspect of the invention, the semiconductor integrated circuit according to the first aspect of the invention further includes:

a receiver circuit for receiving the external data signal transmitted from the transmitter circuit;

a data signal transmission line; and a clock transmission line, wherein the receiver circuit includes:

a data signal amplifier circuit for amplifying the external data signal:

a clock amplifier circuit having a reference clock as an input for amplifying the reference clock:

a receiver DLL circuit for multiplying the frequency of the output of the clock amplifier circuit by m/n (m and n are integers equal to or more than 2 and m>n); and a receiver flipflop circuit for holding the output of the data signal amplifier circuit in synchronization with the output of the receiver DLL circuit, the data signal transmission line transmits the output of the data signal buffer circuit to the data signal amplifier circuit, the clock transmission line transmits the output of the clock buffer circuit to the clock amplifier circuit, and the data signal transmission line and the clock transmission line run in parallel with each other.

With the above configuration, in which the data signal transmission line and the clock transmission line run in parallel with each other, the delay times of the transmission lines can be substantially the same. This makes it easy to latch synchronous data in the receiver FF circuit.

According to a fourth aspect of the invention, in the semiconductor integrated circuit according to the second or third aspect of the invention, the receiver DLL circuit includes:

a variable delay circuit for delaying the output of the clock amplifier circuit and outputting the delayed signal;

a phase comparator circuit for comparing the phase of the output of the clock amplifier circuit with the phase of the output of the variable delay circuit;

an up/down counter for adjusting the delay time of the output signal of the variable delay circuit according to the comparison result from the phase comparator circuit; and a multiplier circuit, the variable delay circuit outputs a total of 2 m signals including a signal having the same phase as the output of the clock amplifier circuit and 2m−1 signals different in phase from one another by 180/m [degree] each, and the multiplier circuit outputs a clock having a frequency m/n times as high as the output of the clock amplifier circuit based on the 2m signals.

According to a fifth aspect of the invention, a semiconductor integrated circuit having a transmitter circuit for transmitting a supplied external data signal and a receiver circuit for receiving the signal transmitted from the transmitter circuit is provided. The transmitter circuit includes:

a frequency divider circuit for multiplying the frequency of a reference clock by n/m (m and n are integers equal to or more than 2 and m>n) to produce a transmission clock;

a transmitter DLL circuit having the transmission clock as an input and outputting a power supply voltage and a ground voltage both having a frequency corresponding to the frequency of the transmission clock;

a VCO circuit having the transmission clock, the power supply voltage and the ground voltage as inputs and outputting a first clock having the same frequency as the reference clock and a second clock having the same frequency as the transmission clock;

a transmitter flipflop circuit for holding an external data signal in synchronization with the first clock;

a data signal buffer circuit for transmitting a data signal held by the transmitter flipflop circuit; and a clock buffer circuit for transmitting the second clock, the receiver circuit includes:

a data signal amplifier circuit for amplifying the data signal transmitted from the data signal buffer circuit:

a clock amplifier circuit for amplifying the second clock transmitted from the clock buffer circuit:

a receiver DLL circuit for multiplying the frequency of the second clock amplified by the clock amplifier circuit by m/n; and a receiver flipflop circuit for holding the output of the data signal amplifier circuit in synchronization with the clock outputted from the receiver DLL circuit, and the transmitter DLL circuit and the receiver DLL circuit have their phase comparator circuits, up/down counters and variable delay circuits that are respectively the same in configuration.

With the above configuration, the receiver DLL circuit follows any change in the frequency of the reference clock while being kept locked.

DESCRIPTION OF THE PREFERRED EMBODIMENTS

Figure 1:
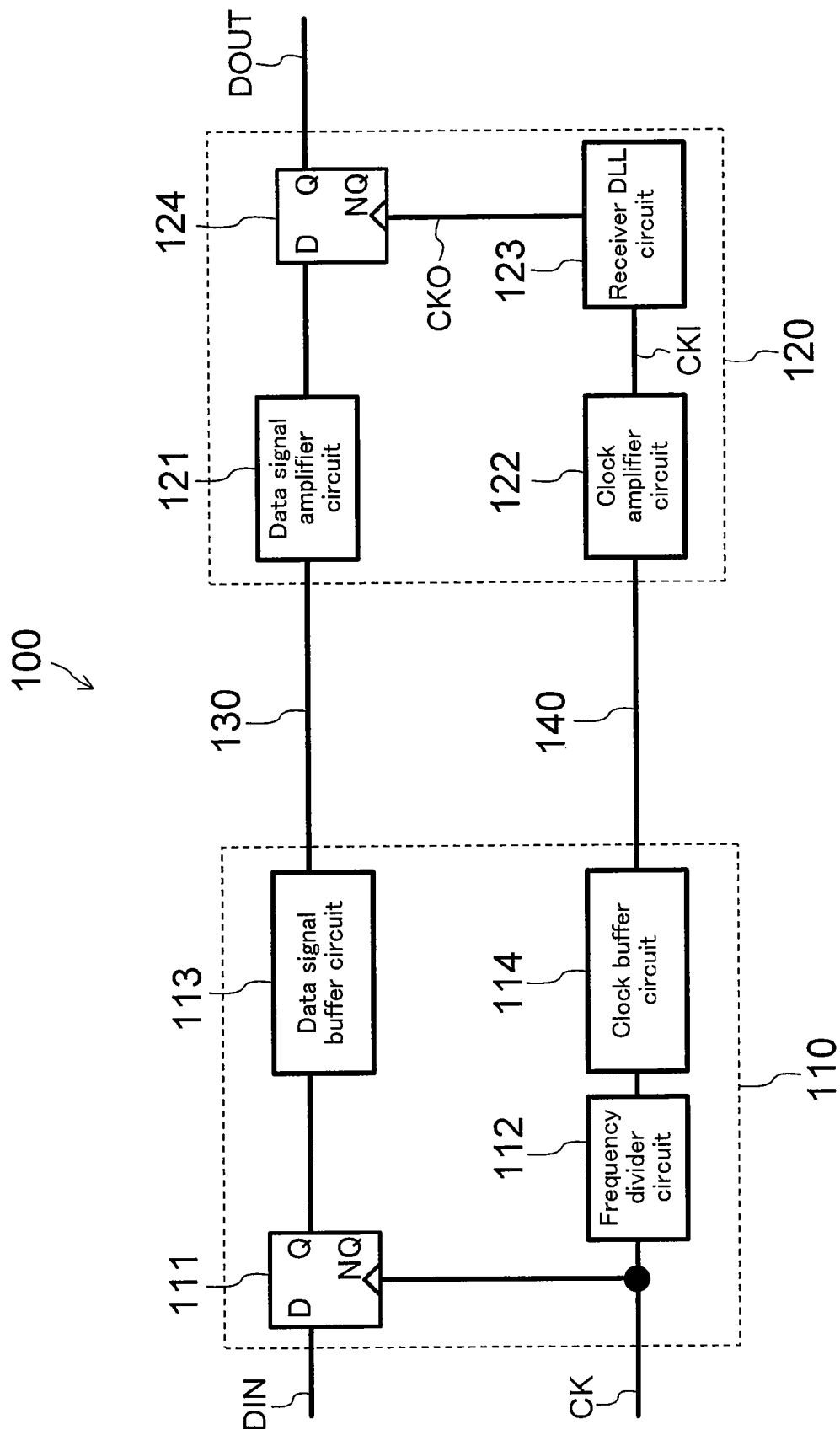
FIG. 1 is a block diagram of a semiconductor integrated circuit 100 of Embodiment 1.

Hereinafter, preferred embodiments of the present invention will be described with reference to the accompanying drawings. Note that in the following description of the embodiments, components having like functions are denoted by the same reference numerals, and the description thereof is not repeated.

Embodiment 1

FIG. 1 is a block diagram of a semiconductor integrated circuit 100 of Embodiment 1 of the present invention. As shown in FIG. 1, the semiconductor integrated circuit 100 includes a transmitter circuit 110, a receiver circuit 120, a data signal transmission line 130 and a clock transmission line 140.

The transmitter circuit 110 transmits an external data signal DIN and a clock used for reception of the external data signal DIN to the receiver circuit 120. The external data signal as used herein refers to a signal transmitted from a circuit other than the transmitter circuit 110 and the like. In other words, the external data signal may be a signal transmitted from outside the semiconductor integrated circuit 100 or a signal transmitted from a circuit other than the transmitter circuit 110 inside the semiconductor integrated circuit 100.

The receiver circuit 120 receives the external data signal DIN transmitted by the transmitter circuit 110 and outputs the signal as an output data signal DOUT. The configurations of the transmitter circuit 110 and the receiver circuit 120 will be described later individually.

The data signal transmission line 130 is a transmission line for transmitting a data signal from the transmitter circuit 110 to the receiver circuit 120. The clock transmission line 140 is a transmission line for transmitting a clock from the transmitter circuit 110 to the receiver circuit 120.

(Configuration of Transmitter Circuit 110)

The transmitter circuit 110 specifically includes a transmitter flipflop (FF) circuit 111, a frequency divider circuit 112, a data signal buffer circuit 113 and a clock buffer circuit 114. The transmitter circuit 110 also includes a data signal input terminal at which the external data signal DIN is inputted and a clock input terminal at which a reference clock CK is inputted.

The transmitter FF circuit 111 holds the external data signal DIN using the reference clock CK as the control signal.

The frequency divider circuit 112 multiplies the frequency of the reference clock CK by n/m (m are n are integers equal to or more than 2, m>n) and outputs the resultant clock.

The data signal buffer circuit 113 outputs the data signal received from the transmitter FF circuit 111 to the data signal transmission line 130.

The clock buffer circuit 114 outputs the clock received from the frequency divider circuit 112 to the clock signal transmission line 140.

(Configuration of Receiver Circuit 120)

The receiver circuit 120 specifically includes a data signal amplifier circuit 121, a clock amplifier circuit 122, a receiver DLL circuit 123 and a receiver FF circuit 124. The receiver circuit 120 also includes a data signal output terminal from which the output data signal DOUT is outputted.

The data signal amplifier circuit 121 amplifies the data signal of a minute potential received from the data signal transmission line 130.

The clock amplifier circuit 122 amplifies the clock of a minute potential received from the clock transmission line 140 and outputs the amplified clock as a clock CKI.

Figure 2:
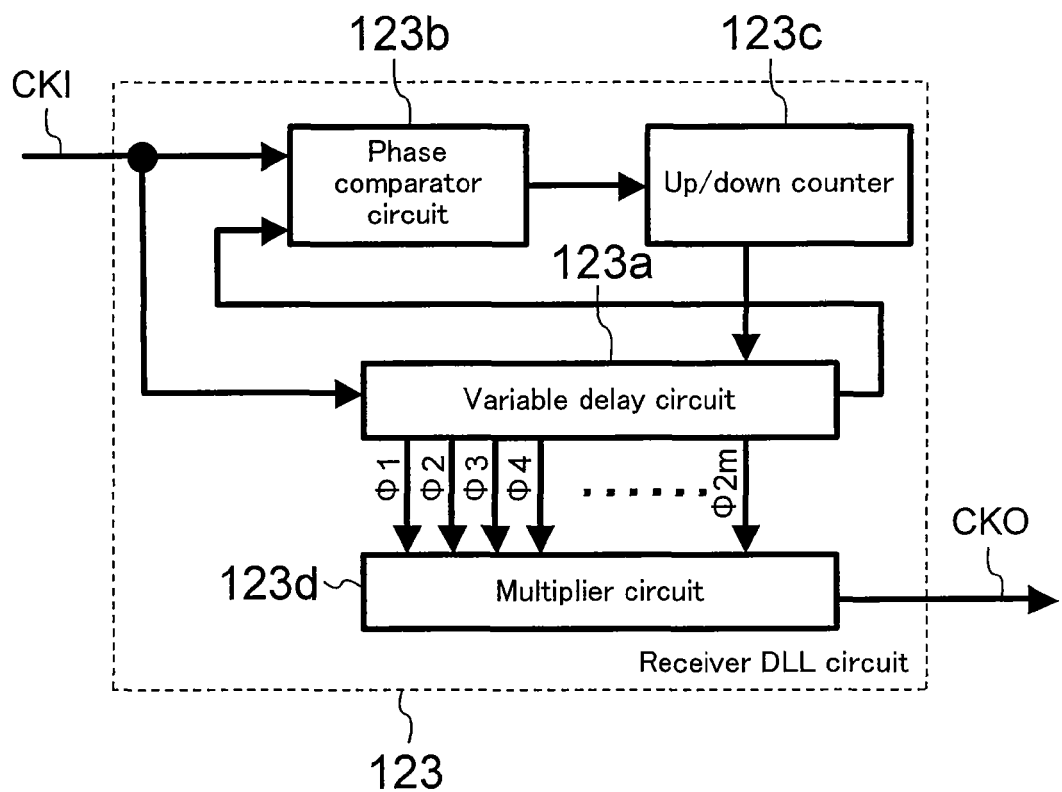
FIG. 2 is a block diagram showing an exemplary configuration of a receiver DLL circuit 123.

The receiver DLL circuit 123, receiving the clock CKI, multiplies the frequency of the clock CKI by m/n and outputs the multiplied clock as a clock CKO. FIG. 2 is a block diagram showing an exemplary configuration of the receiver DLL circuit 123.

In the example of FIG. 2, the receiver DLL circuit 123 includes a variable delay circuit 123a, a phase comparator circuit 123b, an up/down counter 123c and a multiplier circuit 123d.

The variable delay circuit 123a outputs a total of 2m signals having phases different from one another. Specifically, the 2m signals include F 1 having the same phase as the clock CK1, F 2 having a phase difference of (360/2m)×1 [°], F 3 having a phase difference of (360/2m)×2[°], ..., and F 2m having a phase difference of (360/2m)×(2m−1) [°].

The phase comparator circuit 123b compares the phase of the clock CKI with the phase of the output signal of the variable delay circuit 123a.

The up/down counter 123c adjusts the delay time of the output signal of the variable delay circuit 123a according to the comparison result from the phase comparator circuit 123b.

The multiplier circuit 123d outputs a clock whose frequency is m/n-fold of that of the clock outputted from the clock amplifier circuit 122 based on the 2m signals outputted from the variable delay circuit 123a.

The receiver FF circuit 124 holds the data signal outputted from the data signal amplifier circuit 121 using the clock CKO outputted from the receiver DLL circuit 123 as the control signal.

(Operation of Semiconductor Integrated Circuit 100)

In the transmitter circuit 110, the external data signal DIN is inputted via the data signal input terminal and the reference clock CK is inputted via the clock input terminal.

The transmitter FF circuit 111 captures the external data signal DIN at each rising edge of the reference clock CK (control signal), and holds the value of the external data signal DIN until the next rising edge of the reference clock CK. The data signal buffer circuit 113 transfers the data signal outputted from the transmitter FF circuit 111 to the data signal transmission line 130.

The frequency divider circuit 112 converts the reference clock CK to a clock having an n/m-fold frequency and outputs the resultant clock to the clock buffer circuit 114. The clock buffer circuit 114 transfers the clock outputted from the frequency divider circuit 112 to the clock transmission line 140.

The data signal conveyed through the data signal transmission line 130 is attenuated in its voltage amplitude depending on the resistance, capacitance and inductance parasitic to the data signal transmission line 130 and the operating frequency of the data signal before arriving at the receiver circuit 120 (strictly, the data signal amplifier circuit 121). Likewise, the clock conveyed through the clock transmission line 140 is attenuated in its voltage amplitude depending on the resistance, capacitance and inductance parasitic to the clock transmission line 140 and the operating frequency of the clock before arriving at the receiver circuit 120 (strictly, the clock amplifier circuit 122).

The data signal inputted in the receiver circuit 120 is amplified to the full voltage amplitude by the data signal amplifier circuit 121 and then sent to the receiver FF circuit 124. Likewise, the clock inputted in the receiver circuit 120 is amplified to the full voltage amplitude by the clock amplifier circuit 122 and then sent to the receiver DLL circuit 123. The receiver DLL circuit 123 converts the received clock to a clock having an m/n-fold frequency and outputs the resultant clock to the control terminal of the receiver FF circuit 124. The receiver FF circuit 124 holds the data signal outputted from the data signal amplifier circuit 121 in synchronization with the clock (CKO) outputted from the receiver DLL circuit 123 and outputs the held data as the output data signal DOUT.

As described above, in this embodiment, the frequency of the clock to be conveyed through the clock transmission line 140 is n/m-fold (m and n are integers equal to or more than 2, m>n) of the frequency of the reference clock CK. Hence, the voltage amplitude of the eye pattern can be secured. The clock transmitted via the clock transmission line 140 is then converted to a clock having an m/n-fold frequency by the receiver DLL circuit 123. This eliminates the necessity of supplying a clock having the frequency of the reference clock CK to the receiver circuit 120. That is, transmission at a transfer rate higher than the conventional one can be attained with a transmission line having the same structure as the conventional one.

Embodiment 2

Figure 3:
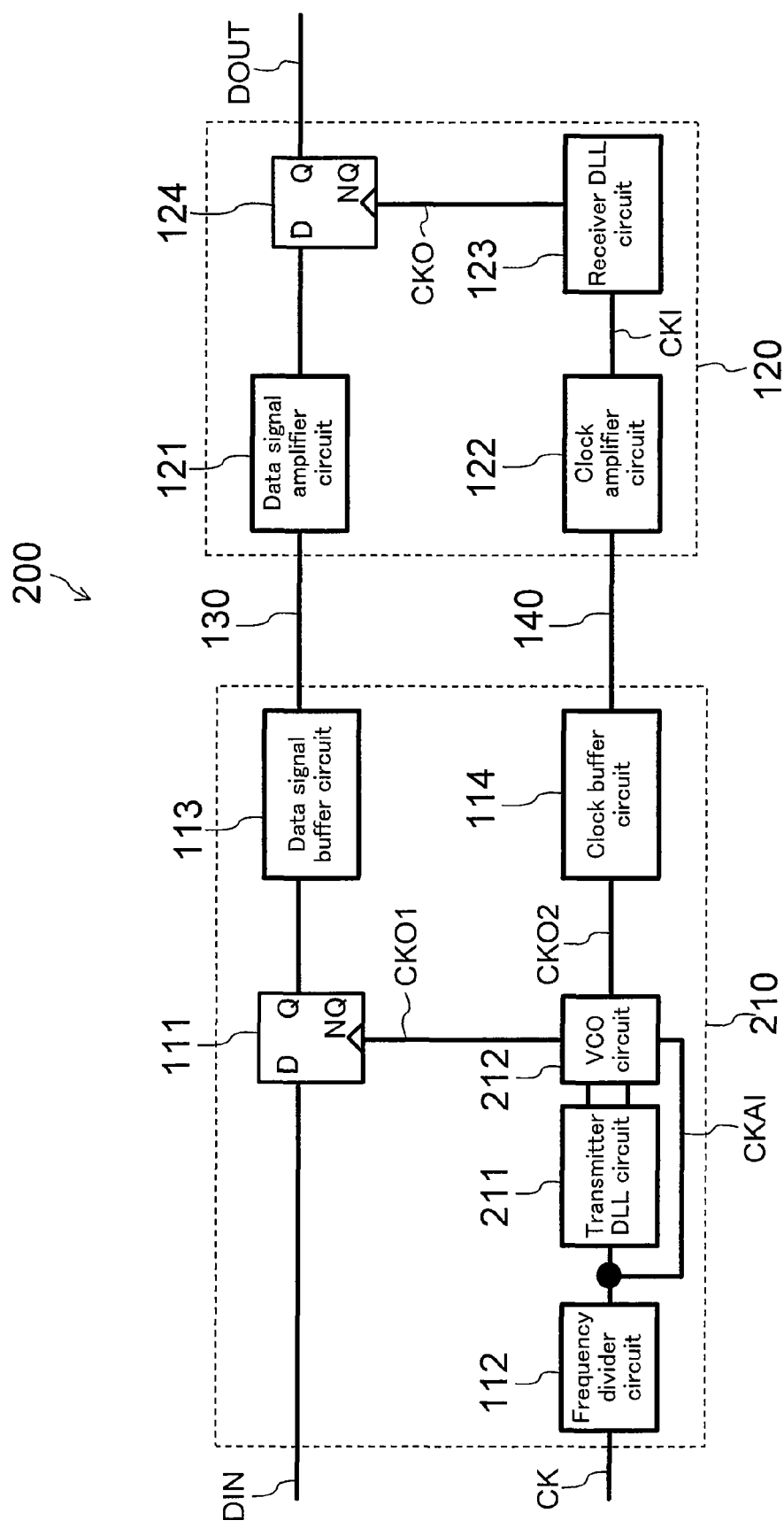
FIG. 3 is a block diagram of a semiconductor integrated circuit 200 of Embodiment 2.

FIG. 3 is a block diagram of a semiconductor integrated circuit 200 of Embodiment 2 of the present invention. As shown in FIG. 3, the semiconductor integrated circuit 200 includes a receiver circuit 120, a data signal transmission line 130, a clock transmission line 140 and a transmitter circuit 210.

The transmitter circuit 210 includes a transmitter FF circuit 111, a frequency divider circuit 112, a data signal buffer circuit 113, a clock buffer circuit 114, a transmitter DLL circuit 211 and a VCO circuit 212.

The transmitter DLL circuit 211, receiving the clock (transmission clock CKAI) outputted from the frequency divider circuit 112, produces a signal delayed from the transmission clock CKAI and outputs a power supply voltage VDDA and a ground voltage VSSA having voltage values corresponding to the delayed amount of the signal.

Figure 4:
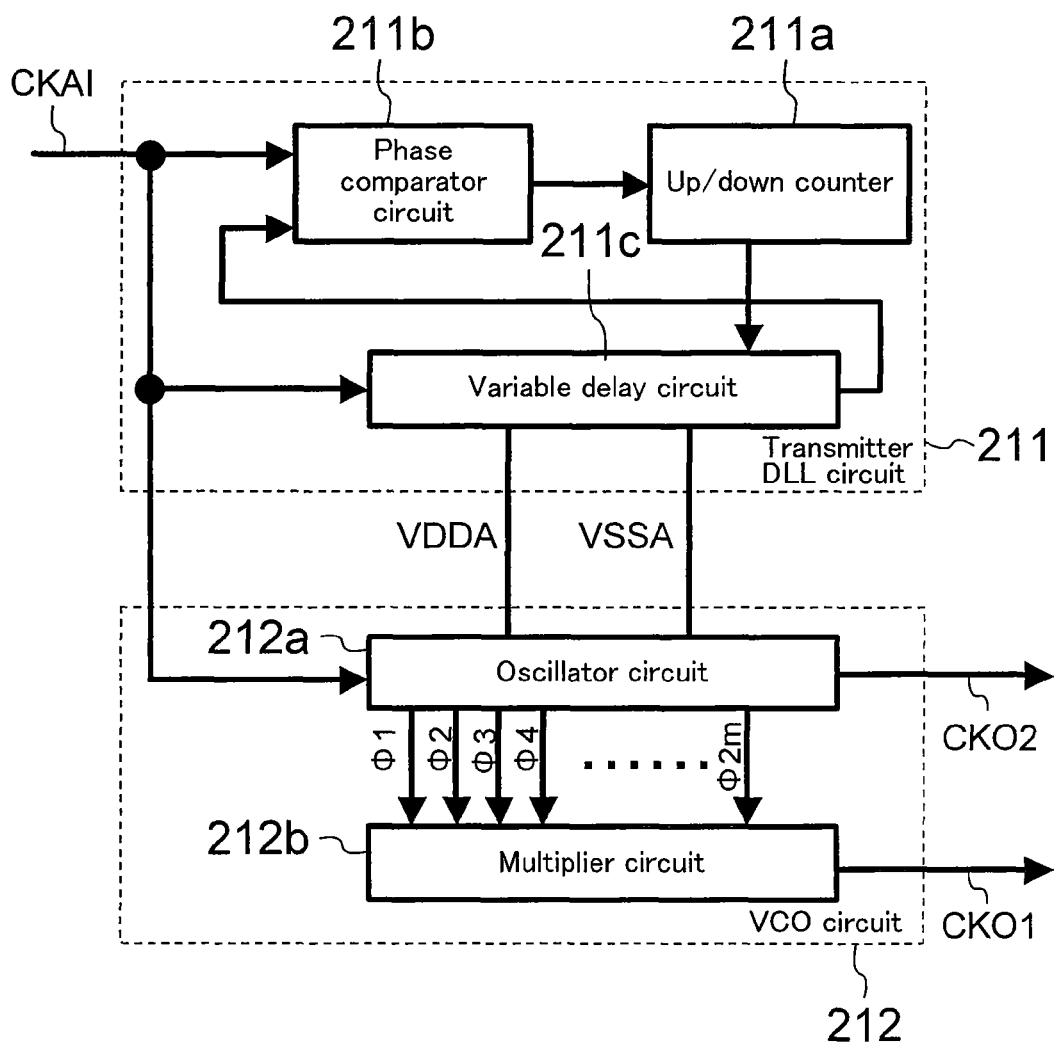
FIG. 4 is a block diagram showing an exemplary configuration of a sending DLL circuit 211 and a VCO circuit 212.

FIG. 4 is a block diagram showing an exemplary configuration of the transmitter DLL circuit 211 and the VCO circuit 212.

The transmitter DLL circuit 211 includes an up/down counter 211c, a phase comparator circuit 211b and a variable delay circuit 211c.

The up/down counter 211a adjusts the delay time of the output signal of the variable delay circuit 211c.

The phase comparator circuit 211b compares the phase of the transmission clock CKAI with the phase of the output signal of the variable delay circuit 211c for control of the up/down counter 211a.

The variable delay circuit 211c delays the transmission clock CKAI according to the output of the up/down counter 211a, and outputs the delayed clock to the phase comparator circuit 211b, and also outputs the power supply voltage VDDA and the ground voltage VSSA having voltage values corresponding to the delayed amount to the VCO circuit 212.

The VCO circuit 212 receives the transmission clock CKAI, the power supply voltage VDDA and the ground voltage VSSA as inputs, and outputs a first clock CKO1 having the same frequency as the reference clock CK to the transmitter FF circuit 111 as the control signal. The VCO circuit 212 also outputs a second clock CKO2 having a frequency n/m-fold of the reference clock CK to the clock buffer circuit 114.

Specifically, as shown in FIG. 4, the VCO circuit 212 includes an oscillator circuit 212a and a multiplier circuit 212b.

The oscillator circuit 212a outputs a total of 2m clocks having phases different from one another, as well as the second clock CKO2 having the same phase as the transmission clock CKAI, all of which have a frequency corresponding to the voltages VDDA and VSSA. The 2m clocks outputted from the oscillator circuit 212a include F1 having the same phase as the transmission clock CKAI, F 2 having a phase difference of (360/2m)×1 [°] from the transmission clock CKA1, F 3 having a phase difference of (360/2m)× 2 [°], . . . , and F 2m having a phase difference of (360/2m)× (2m−1) [°].

The multiplier circuit 212b outputs the first clock CKO1 having a frequency m/n-fold of the transmission clock CKAI (i.e., the same frequency as that of the reference clock CK) using the 2m clocks outputted from the oscillator circuit 212a.

(Operation of Semiconductor Integrated Circuit 200)

First, the operation in the steady state will be described.

In the transmitter circuit 210, the external data signal DIN is inputted via the data signal input terminal and the reference clock CK is inputted via the clock input terminal.

The reference clock CK is sent to the frequency divider circuit 112, which produces the transmission clock CKAI having a frequency n/m-fold of the frequency of the reference clock CK and outputs the transmission clock CKAI to the VCO circuit 212. The VCO circuit 212 multiplies the transmission clock CKAI by m/n to obtain the first clock CKO1 having the same frequency as the reference clock CK and outputs the first clock CKO1 to the transmitter FF circuit 111. The VCO circuit 212 also outputs the second clock CKO2 having the same frequency as the transmission clock CKAI to the clock buffer circuit 114. The clock buffer circuit 114 transfers the second clock CKO2 to the clock transmission line 140.

The transmitter FF circuit 111 captures the external data signal DIN at each rising edge of the first clock CKO1 (control signal), and holds the value of the external data signal DIN until the next rising edge of the first clock CKO1.

The data signal buffer circuit 113 transfers the data signal outputted from the transmitter FF circuit 111 to the data signal transmission line 130. The data signal conveyed through the data signal transmission line 130 is attenuated in its voltage amplitude depending on the resistance, capacitance and inductance parasitic to the data signal transmission line 130 and the operating frequency of the data signal before arriving at the receiver circuit 120. Likewise, the clock conveyed through the clock transmission line 140 is attenuated in its voltage amplitude depending on the resistance, capacitance and inductance parasitic to the clock transmission line 140 and the operating frequency of the clock before arriving at the receiver circuit 120.

The data signal inputted in the receiver circuit 120 is amplified to the full voltage amplitude by the data signal amplifier circuit 121 and then sent to the receiver FF circuit 124. Likewise, the clock inputted in the receiver circuit 120 is amplified to the full voltage amplitude by the clock amplifier circuit 122 and then sent to the receiver DLL circuit 123. The receiver DLL circuit 123 converts the received clock to a clock having an m/n-fold frequency and outputs the resultant clock to the control terminal of the receiver FF circuit 124.

Next, the operation observed after the frequency of the reference clock CK changes from f1 [Hz] to f2 [Hz] (f1>f2) will be described.

When the frequency has been switched from F1 to F2, the transmitter DLL circuit 211 varies the delay of the variable delay circuit 211c so as to obtain (f2)/2 to thereby allow re-locking of the delay. The variable delay circuit 211c and the oscillator circuit 212a use the power supply voltage VDDA and the ground voltage VSSA in common. Hence, the frequency in the oscillator circuit 212a changes following the delay variation in the variable delay circuit 211c. The changed frequency is transmitted to the receiver DLL circuit 123 of the receiver circuit 120 via the clock transmission line 140. The delay variation in the variable delay circuit 123a of the receiver DLL circuit 123 is the same as that in the variable delay circuit 211c of the transmitter DLL circuit 211. Hence, the receiver DLL circuit 123 follows the change of the frequency of the reference clock CK while keeping the locking.

In other words, in the semiconductor integrated circuit 200, operation can be made while changing the frequency of the clock for the transmitter FF circuit 111 and the receiver FF circuit 124 in stages.

As described above, in this embodiment, even when the frequency of the reference clock CK has changed, no wait time is necessary for re-locking of the DLL circuit. Hence, the frequency of the clock inputted into the FF circuits of the transmitter circuit and the receiver circuit can be changed in stages to secure a high transfer rate.

Since the second clock CKO2 and the clock Φ are same in phase, either one of them may be shared. In the case of sharing, the phase comparator circuit 211b, the up/down counter 211a and the variable delay circuit 211c of the transmitter DLL circuit 211 should be the same in configuration as the counterparts of the receiver DLL circuit 123. Also, the variable delay circuit 211c and the delay circuit in the oscillator circuit 212a for producing delays should be the same in configuration and use the power supply voltage VDDA and ground voltage VSSA in common.

Embodiment 3

Figure 5:
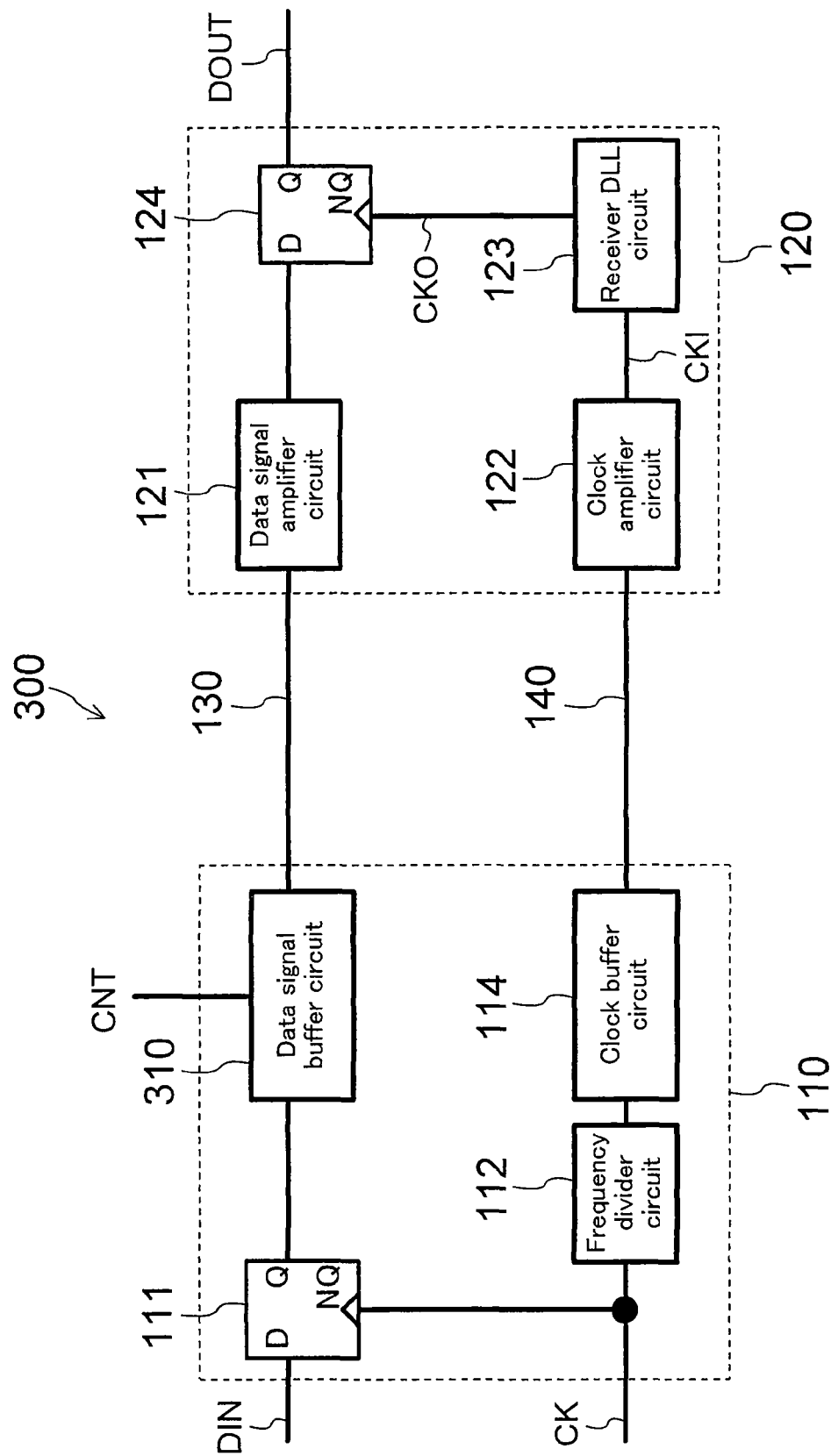
FIG. 5 is a block diagram of a semiconductor integrated circuit 300 of Embodiment 3.

FIG. 5 is a block diagram of a semiconductor integrated circuit 300 of Embodiment 3 of the present invention. The semiconductor integrated circuit 300 is different from the semiconductor integrated circuit 100 (Embodiment 1) in the configuration of the transmitter circuit 110. Specifically, the transmitter circuit 110 in this embodiment has a data signal buffer circuit 310 in place of the data signal buffer circuit 113 as shown in FIG. 5.

The data signal buffer circuit 310 selects either one of the data signal outputted from the transmitter FF circuit 111 (hereinafter called an input signal INA) and the inverted signal of the input signal INA according to a supplied control signal CNT (described later).

Figure 6:
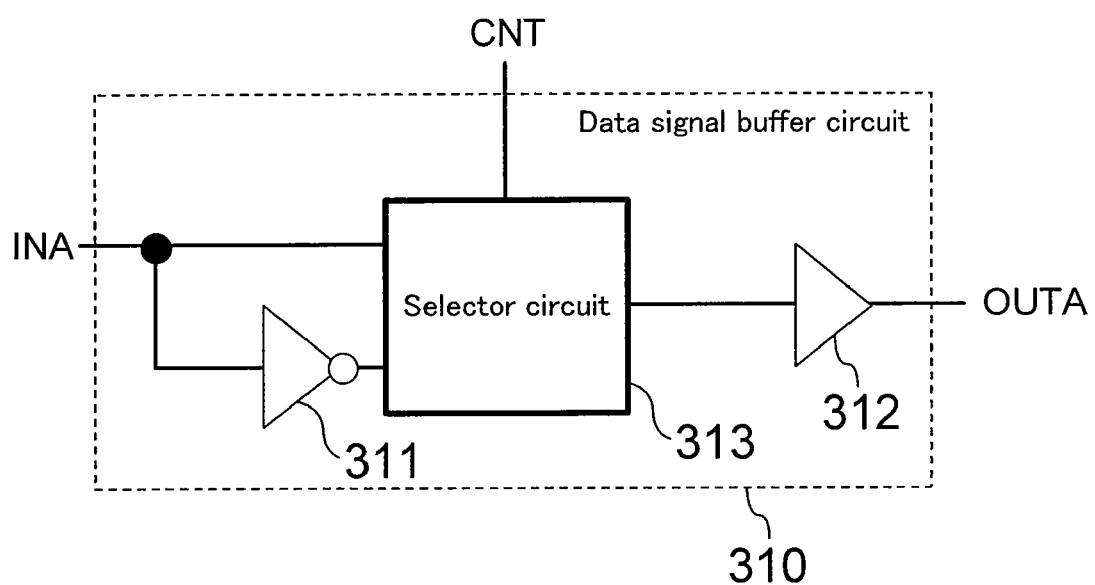
FIG. 6 is a block diagram showing an exemplary configuration of a data signal buffer circuit 310.

FIG. 6 is a block diagram showing an exemplary configuration of the data signal buffer circuit 310. The data signal buffer circuit 310 includes an inverter 311, a buffer circuit 312 and a selector circuit 313.

The inverter 311 inverts the input signal INA and outputs the inverted signal to the selector circuit 313.

The buffer circuit 312 amplifies the output of the selector circuit 313 and outputs the result to the data signal transmission line 130.

The selector circuit 313, receiving the input signal INA and the output of the inverter 311 (inverted signal of the input signal INA), selects either one of the inputted signals according to the control signal CNT and outputs the selected signal.

The control signal CNT has H period and L period in one cycle. Based on the control signal CNT, the selector circuit 313 controls the period during which the input signal INA is outputted and the period during which the inverted signal of the input signal INA is outputted. Thus, with the periods of output of the normal and inverted signals of the input signal INA being provided in one cycle, the effect of intersymbol interference, like continuation of same data, can be reduced. Moreover, by controlling the H and L periods of the control signal CNT, the effect of intersymbol interference can be further reduced.

(Operation of Semiconductor Integrated Circuit 300)

In the transmitter circuit 110, the external data signal DIN is inputted via the data signal input terminal and the reference clock CK is inputted via the clock input terminal. The transmitter FF circuit 111 captures the external data signal DIN at each rising edge of the reference clock CK (control signal), and holds the value of the external data signal DIN until the next rising edge of the reference clock CK. The data signal buffer circuit 310 transfers the data signal outputted from the transmitter FF circuit 111 to the data signal transmission line 130. In the data signal buffer circuit 310, however, the periods during which the normal and inverted signals of the input signal INA are respectively outputted are provided in one cycle depending on the control signal CNT.

The frequency divider circuit 112 converts the reference clock CK to a clock having an n/m-fold frequency and outputs the resultant clock to the clock buffer circuit 114. The clock buffer circuit 114 transfers the clock outputted from the frequency divider circuit 112 to the clock transmission line 140.

The data signal conveyed through the data signal transmission line 130 is attenuated in its voltage amplitude depending on the resistance, capacitance and inductance parasitic to the data signal transmission line 130 and the operating frequency of the data signal before arriving at the receiver circuit 120. Likewise, the clock conveyed through the clock transmission line 140 is attenuated in its voltage amplitude depending on the resistance, capacitance and inductance parasitic to the clock transmission line 140 and the operating frequency of the clock before arriving at the receiver circuit 120.

The data signal inputted in the receiver circuit 120 is amplified to the full voltage amplitude by the data signal amplifier circuit 121 and then sent to the receiver FF circuit 124. Likewise, the clock inputted into the receiver circuit 120 is amplified to the full voltage amplitude by the clock amplifier circuit 122 and then sent to the receiver DLL circuit 123. The receiver DLL circuit 123 converts the received clock to a clock having an m/n-fold frequency and outputs the resultant clock to the control terminal of the receiver FF circuit 124.

As described above, in this embodiment, the frequency of the clock to be conveyed through the clock transmission line 140 is n/m-fold (m and n are integers equal to or more than 2, m>n) of the frequency of the reference clock CK. Hence, the voltage amplitude of the eye pattern can be secured.

The clock transmitted through the clock transmission line 140 is then converted to a clock having an m/n-fold frequency by the receiver DLL circuit 123. This eliminates the necessity of supplying a clock having the frequency of the reference clock CK to the receiver circuit 120.

Moreover, with the periods during which the normal and inverted signals of the input signal INA are respectively outputted being provided in one cycle, the effect of intersymbol interference, like continuation of same data, can be reduced. Also, by controlling the H and L periods of the control signal, the effect of intersymbol interference can be further reduced.

Embodiment 4

Figure 7:
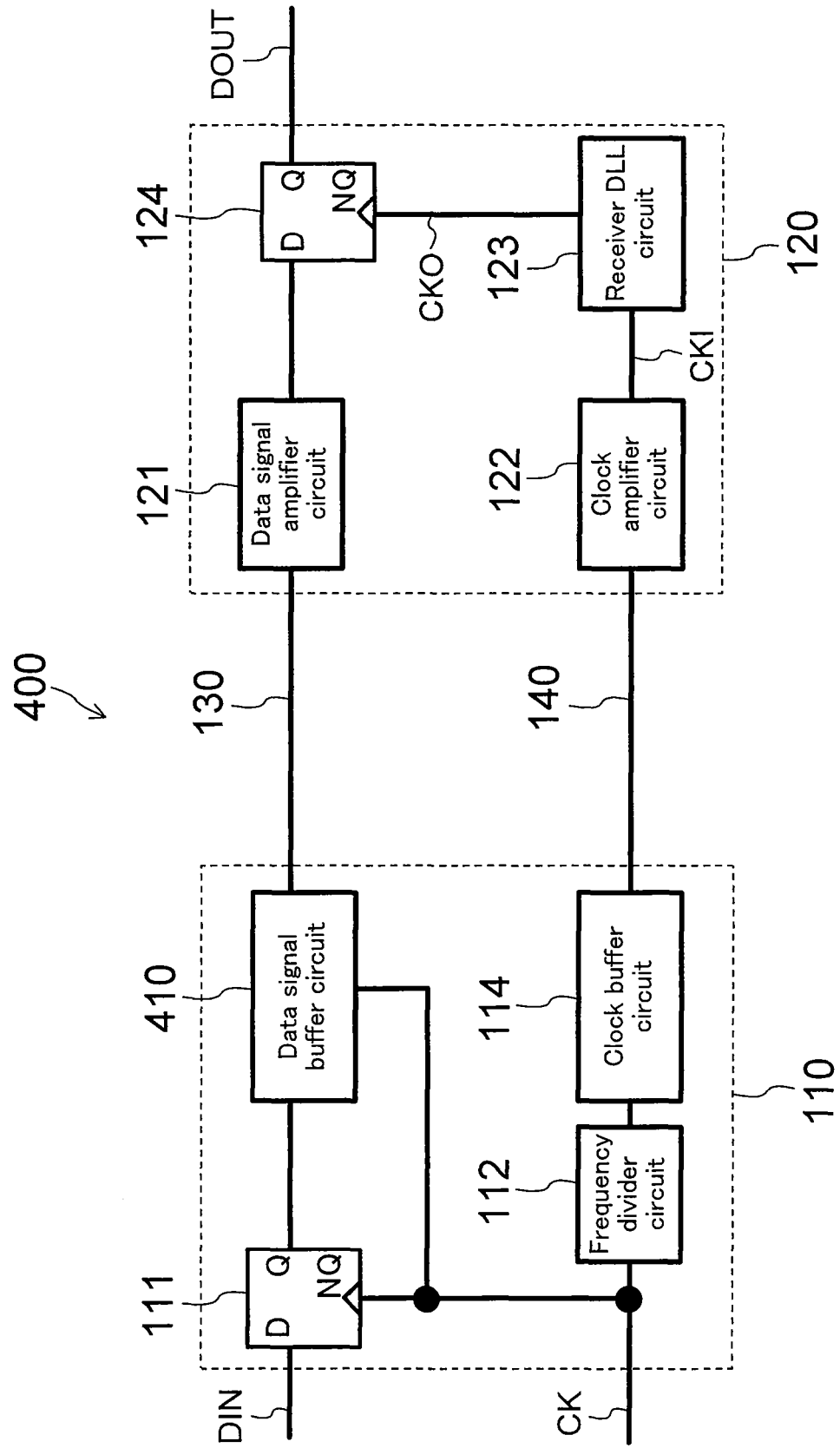
FIG. 7 is a block diagram of a semiconductor integrated circuit 400 of Embodiment 4.

FIG. 7 is a block diagram of a semiconductor integrated circuit 400 of Embodiment 4 of the present invention. The semiconductor integrated circuit 400 is different from the semiconductor integrated circuit 100 (Embodiment 1) in the configuration of the transmitter circuit 110. Specifically, the transmitter circuit 110 in this embodiment includes a data signal buffer circuit 410 in place of the data signal buffer circuit 113 as shown in FIG. 7.

Figure 8:
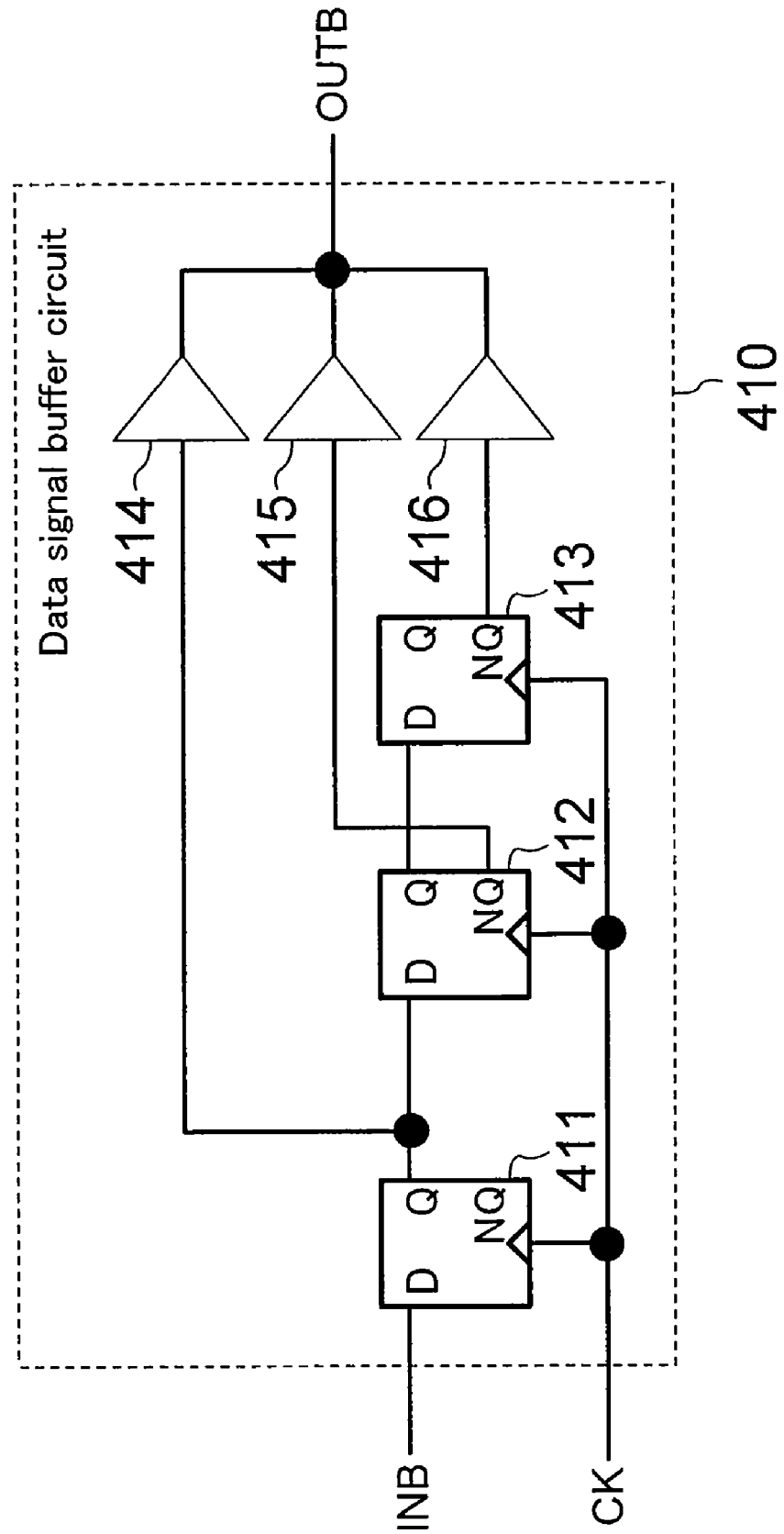
FIG. 8 is a block diagram showing an exemplary configuration of a data signal buffer circuit 410.

FIG. 8 is a block diagram showing an exemplary configuration of the data signal buffer circuit 410. The data signal buffer circuit 410 includes flipflop (FF) circuits 411, 412 and 413 and buffer circuits 414, 415 and 416.

The FF circuit 411 receives the output of the transmitter FF circuit 111 (hereinafter called an input signal INB), the FF circuit 412 receives data from the normal data output of the FF circuit 411, and the FF circuit 413 receives data from the normal data output of the FF circuit 412. The FF circuits 411, 412 and 413 hold their inputted data signals in response to the reference clock CK.

The buffer circuits 414, 415 and 416 constitute a 3-tap preemphasis circuit: the buffer circuit 414 receives data from the normal data output of the FF circuit 411, the buffer circuit 415 receives data from the inverted data output of the FF circuit 412, and the buffer circuit 416 receives data from the inverted data output of the FF circuit 413. The outputs of the buffer circuits 414, 415 and 416 are short-circuited where the driving capability of the buffer circuit 414 is assumed greater than those of the buffer circuits 415 and 416.

(Operation of Semiconductor Integrated Circuit 400)

In the semiconductor integrated circuit 400, as in the semiconductor integrated circuit 100 (Embodiment 1), the data signal and the clock of a frequency n/m-fold of the frequency of the reference clock CK are respectively transmitted from the transmitter circuit 110 to the receiver circuit 120 via the data signal transmission line 130 and the clock transmission line 140. Hence, in the semiconductor integrated circuit 400, also, substantially the same effect as that obtained in the semiconductor integrated circuit 100 can be attained.

Moreover, with the use of the 3-tap preemphasis circuit in the data signal buffer circuit 410, the effect of post-cursor intersymbol interference can be reduced.

Embodiment 5

In Embodiment 5, applications of the semiconductor integrated circuit described above (any of the semiconductor integrated circuits of Embodiments 1 to 4) will be described.

(Application 1)

Figure 9:
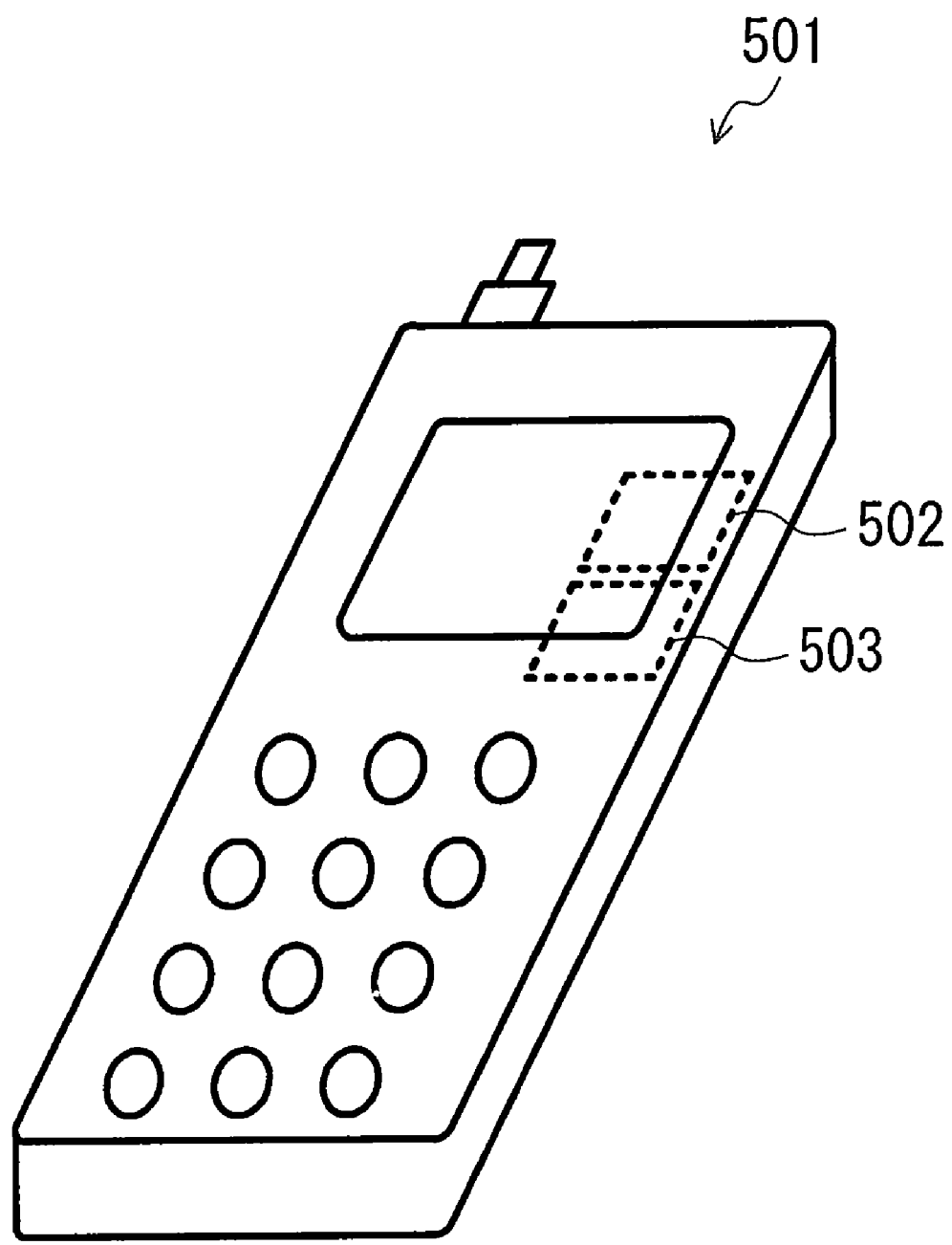
FIG. 9 is a view showing the outline of a cellular phone 501 as an example of communication apparatus having the semiconductor integrated circuit of the present invention.
Figure 10:
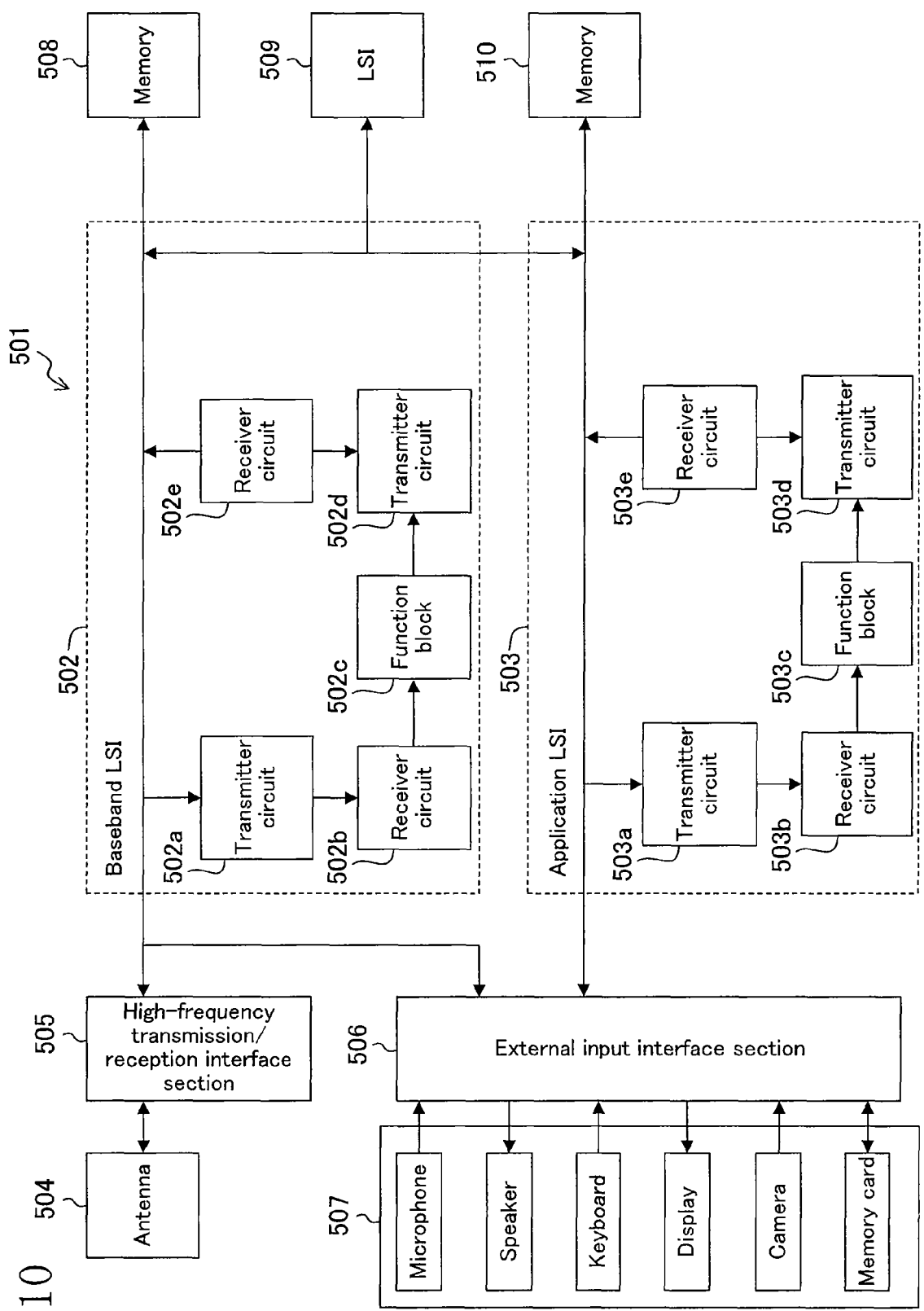
FIG. 10 is a block diagram of the cellular phone 501.

FIG. 9 is a view showing the outline of a cellular phone 501 as an example of communication apparatus having the semiconductor integrated circuit of the present invention. FIG. 10 is a block diagram of the cellular phone 501.

As shown in FIG. 10, the cellular phone 501 includes a baseband LSI 502, an application LSI 503, an antenna 504, a high-frequency transmission/reception interface section 505, an external input interface section 506, a function section 507, a memory 508, an LSI 509 and a memory 510.

The baseband LSI 502 is a circuit block of basic components of this communication apparatus (cellular phone 501). Specifically, the baseband LSI 502 includes a transmitter circuit 502a, a receiver circuit 502b, a function block 502c, a transmitter circuit 502d and a receiver circuit 502e. The transmitter circuits 502a and 502d are any of the transmitter circuits described in Embodiments 1 to 4, and the receiver circuits 502b and 502e are any of the receiver circuits described in Embodiments 1 to 4. In other words, the baseband LSI 502 is a semiconductor integrated circuit having the semiconductor integrated circuit of the present invention. The transmitter circuit 502a receives a signal from outside the baseband LSI 502, the receiver circuit 502b receives data from the transmitter circuit 502a, the function block 502c receives data from the receiver circuit 502b, the transmitter circuit 502d receives data from the function block 502c, and the receiver circuit 502e receives data from the transmitter circuit 502d.

The application LSI 503 has a circuit block of application-related components of this communication apparatus. Specifically, the application LSI 503 includes a transmitter circuit 503a, a receiver circuit 503b, a function block 503c, a transmitter circuit 503d and a receiver circuit 503e. The transmitter circuits 503a and 503d are any of the transmitter circuits described in Embodiments 1 to 4, and the receiver circuits 503b and 503e are any of the receiver circuits described in Embodiments 1 to 4. In other words, the application LSI 503 is a semiconductor integrated circuit having the semiconductor integrated circuit of the present invention. The transmitter circuit 503a receives a signal from outside the application LSI 503, the receiver circuit 503b receives data from the transmitter circuit 503a, the function block 503c receives data from the receiver circuit 503b, the transmitter circuit 503d receives data from the function block 503c, and the receiver circuit 503e receives data from the transmitter circuit 503d.

The high-frequency transmission/reception interface section 505 mediates transmission and reception of a radio signal performed by the baseband LSI 502. The external input interface section 506 mediates transmission and reception of a wired signal performed by the baseband LSI 502 and the application LSI 503.

The function section 507, which includes a microphone, a speaker, a keyboard, a display, a camera and a memory card, performs input of an audio signal via the microphone, output of an audio signal via the speaker, acceptance of various instructions and the like from the user via the keyboard, display of data on the display, data input/output from/to the camera, the memory card and the like, and so on. The memories 508 and 510 are respectively used by the baseband LSI 502 and the application LSI 503. The LSI 509 performs processing of the outputs of the baseband LSI 502 and the application LSI 503 and the like, for example.

With the above configuration described above, in the cellular phone 501 (communication apparatus), the baseband LSI 502 and the application LSI 503 are allowed to execute high-speed communication between the outside and an inner function block of each LSI and between function blocks inside each LSI.

Any semiconductor integrated circuit other than the baseband LSI 502 and the application LSI 503 that is provided in the cellular phone 501 can also attain substantially the same effect as that described above by using the semiconductor integrated circuit of the present invention as its logic circuit.

It should be noted that the configuration of the cellular phone 501 of FIG. 10 is given to show an example of the relationship between the present invention and a communication apparatus. The functions of the cellular phone 501 are not limited to the illustrated ones, but addition of any function and change of the configuration may be made as long as no problem occurs in the system. Also, the functions of the LSIs can be freely changed as long as integration can be done.

The communication apparatus having the semiconductor integrated circuit of the present invention should not be limited to the cellular phone but also include a transmitter/receiver in a communication system, a modem apparatus for data transmission and the like, for example. In other words, according to the present invention, communication between the outside and an inner function block of an LSI and communication between function blocks inside an LSI can be executed at high speed in any communication apparatus irrespective of whether wired or wireless, whether optical communication or telecommunication, and whether digital or analog.

(Application 2)

Figure 11:
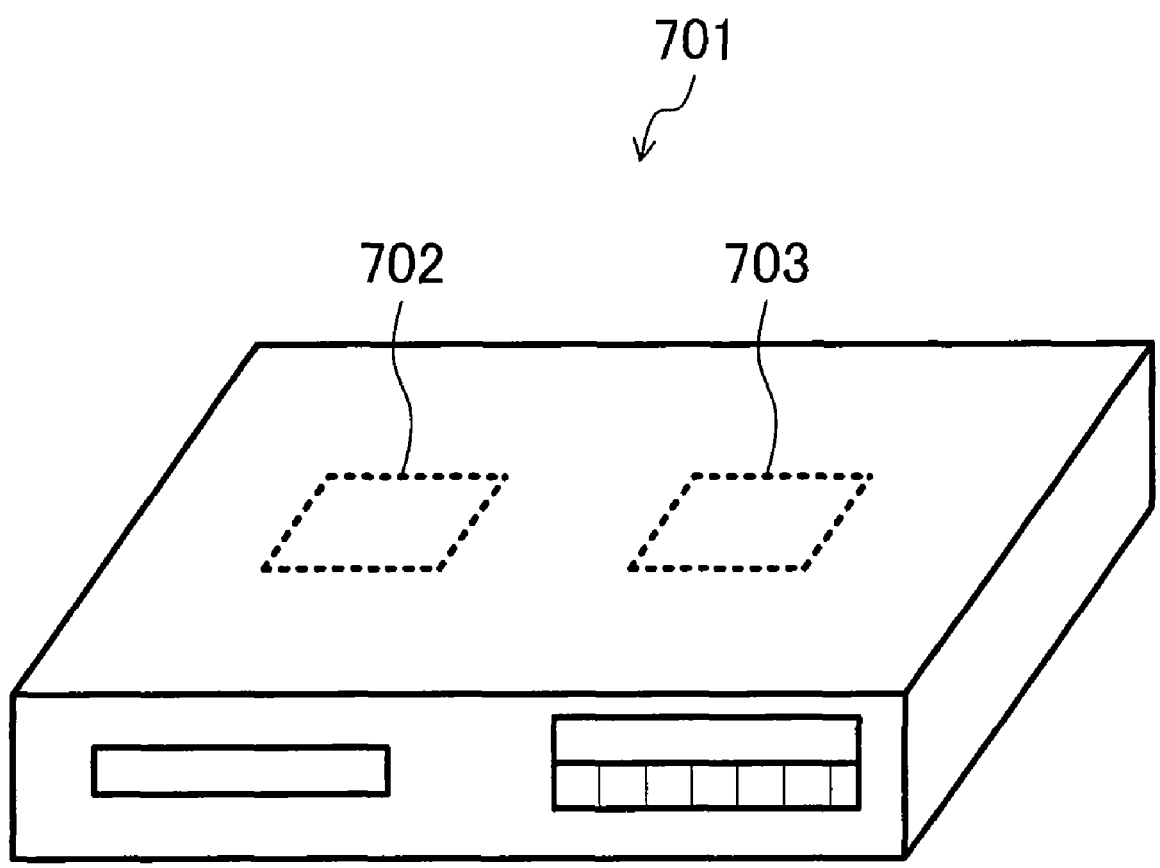
FIG. 11 is a view showing the outline of an optical disc apparatus 701 as an example of information playback apparatus having the semiconductor integrated circuit of the present invention.
Figure 12:
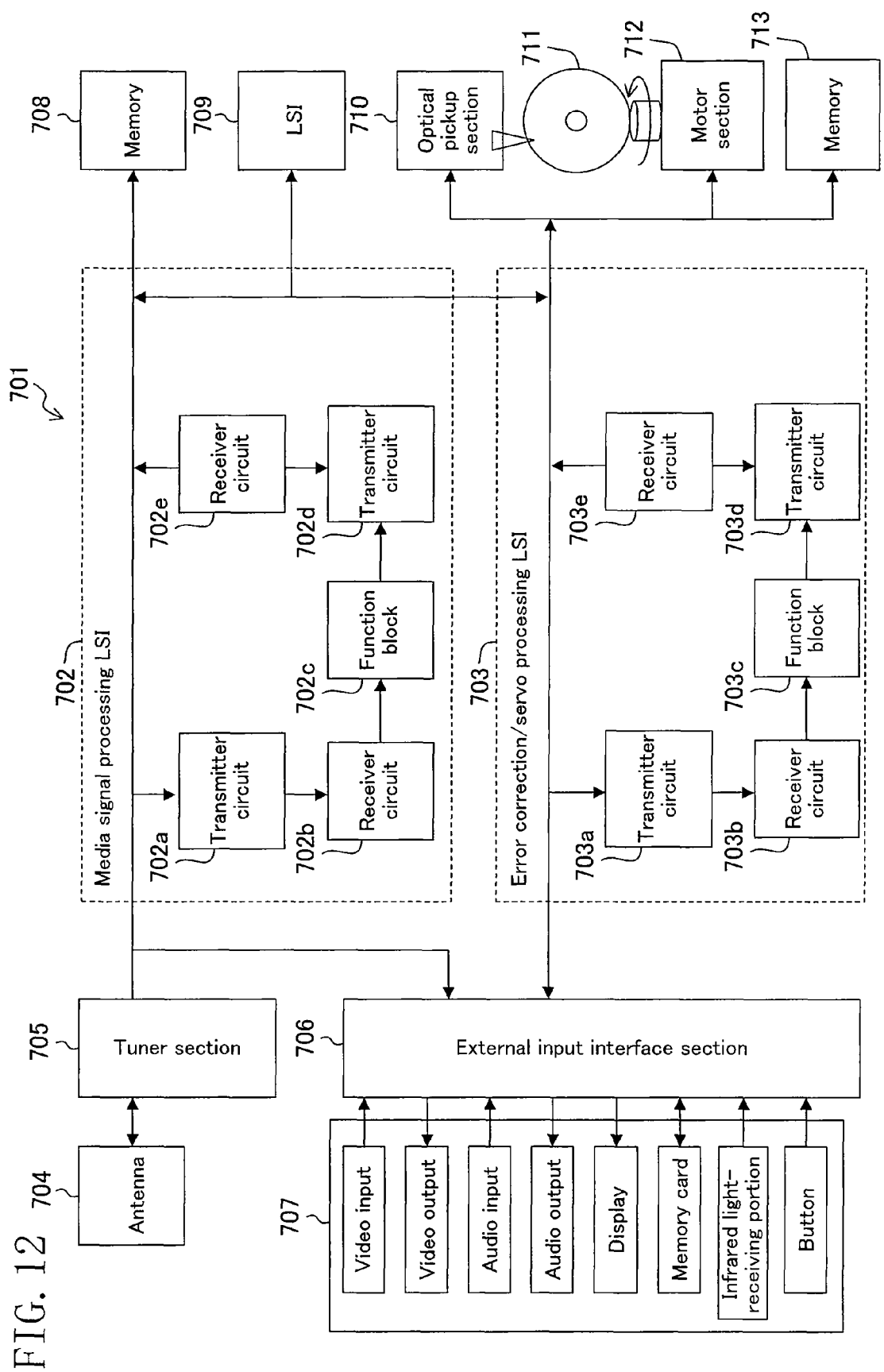
FIG. 12 is a block diagram of the optical disc apparatus 701.

FIG. 11 is a view showing the outline of an optical disc apparatus 701 as an example of information playback apparatus having the semiconductor integrated circuit of the present invention. FIG. 12 is a block diagram of the optical disc apparatus 701.

As shown in FIG. 12, the optical disc apparatus 701 includes a media signal processing LSI 702, an error correction/servo processing LSI 703, an antenna 704, a tuner section 705, an external input interface section 706, a function section 707, a memory 708, an LSI 709, an optical pickup section 710, a recording medium 711, a motor section 712 and a memory 713.

The media signal processing LSI 702, which has a circuit block of basic components for processing of a media signal in the optical disc apparatus 701, processes a signal read from the recording medium 711. The media signal processing LSI 702 specifically includes a transmitter circuit 702a, a receiver circuit 702b, a function block 702c, a transmitter circuit 702d and a receiver circuit 702e. The transmitter circuits 702a and 702d are any of the transmitter circuits described in Embodiments 1 to 4, and the receiver circuits 702b and 702e are any of the receiver circuits described in Embodiments 1 to 4. In other words, the media signal processing LSI 702 is a semiconductor integrated circuit having the semiconductor integrated circuit of the present invention. The transmitter circuit 702a receives a signal from outside the media signal processing LSI 702, the receiver circuit 702b receives data from the transmitter circuit 702a, the function block 702c receives data from the receiver circuit 702b, the transmitter circuit 702d receives data from the function block 702c, and the receiver circuit 702e receives data from the transmitter circuit 702d.

The error correction/servo processing LSI 703, which has a circuit block for error correction/servo processing in the optical disc apparatus 701, performs error correction of a signal read from the optical disc and serve control of the optical pickup. The error correction/servo processing LSI 703 specifically includes a transmitter circuit 703a, a receiver circuit 703b, a function block 703c, a transmitter circuit 703d and a receiver circuit 703e. The transmitter circuits 703a and 703d are any of the transmitter circuits described in Embodiments 1 to 4, and the receiver circuits 703b and 703e are any of the receiver circuits described in Embodiments 1 to 4. In other words, the error correction/servo processing LSI 703 is a semiconductor integrated circuit having the semiconductor integrated circuit of the present invention. The transmitter circuit 703a receives a signal from outside the error correction/servo processing LSI 703, the receiver circuit 703b receives data from the transmitter circuit 703a, the function block 703c receives data from the receiver circuit 703b, the transmitter circuit 703d receives data from the function block 703c, and the receiver circuit 703e receives data from the transmitter circuit 703d.

The tuner section 705 receives a TV broadcast and the like, for example, via the antenna 704. The external input interface section 706 mediates communication between the function section 707 and the media signal processing LSI 702 and communication between the function section 707 and the error correction/servo processing LSI 703.

The function section 707, which includes a video input portion, a video output portion, an audio input portion, an audio output portion, a display, a memory card, an infrared light-receiving portion and a button, performs input/output of a video signal and an audio signal, display of data on the display, data input/output from/to the memory card, and acceptance of various instructions and information from the user via the infrared light-receiving portion and the button. The memories 708 and 713 are respectively used by the media signal processing LSI 702 and the error correction/servo processing LSI 703. The LSI 709 performs processing of the outputs of the media signal processing LSI 702 and the error correction/servo processing LSI 703 and the like, for example.

The recording medium 711 is an optical recording medium such as a digital versatile disc (DVD) and a compact disc (CD). The motor section 712 rotates the recording medium 711. The optical pickup section 710 reads information recorded on the recording medium 711.

With the configuration described above, in the optical disc apparatus 701 (information playback apparatus), the media signal processing LSI 702 and the error correction/servo processing LSI 703 are allowed to execute high-speed communication between the outside and an inner function block of each LSI and between function blocks inside each LSI It should be noted that FIG. 12 is given to show an example of the relationship between the present invention and an optical disc apparatus. The functions of the optical disc apparatus 701 are not limited to the illustrated ones, but addition of any function and change of the configuration may be made as long as no problem occurs in the system. Also, the functions of the LSIs can be freely changed as long as integration can be done.

The information playback apparatus having the semiconductor integrated circuit of the present invention should not be limited to the optical disc apparatus but also include an image recording/playback apparatus incorporating a magnetic disc, an information recording/playback apparatus having a semiconductor memory as a medium and the like, for example. In other words, according to the present invention, communication between the outside and an inner function block of an LSI and communication between function blocks inside an LSI can be executed at high speed in any information playback apparatus (which may include the information recording function) irrespective of the medium on which information is recorded.

(Application 3)

Figure 13:
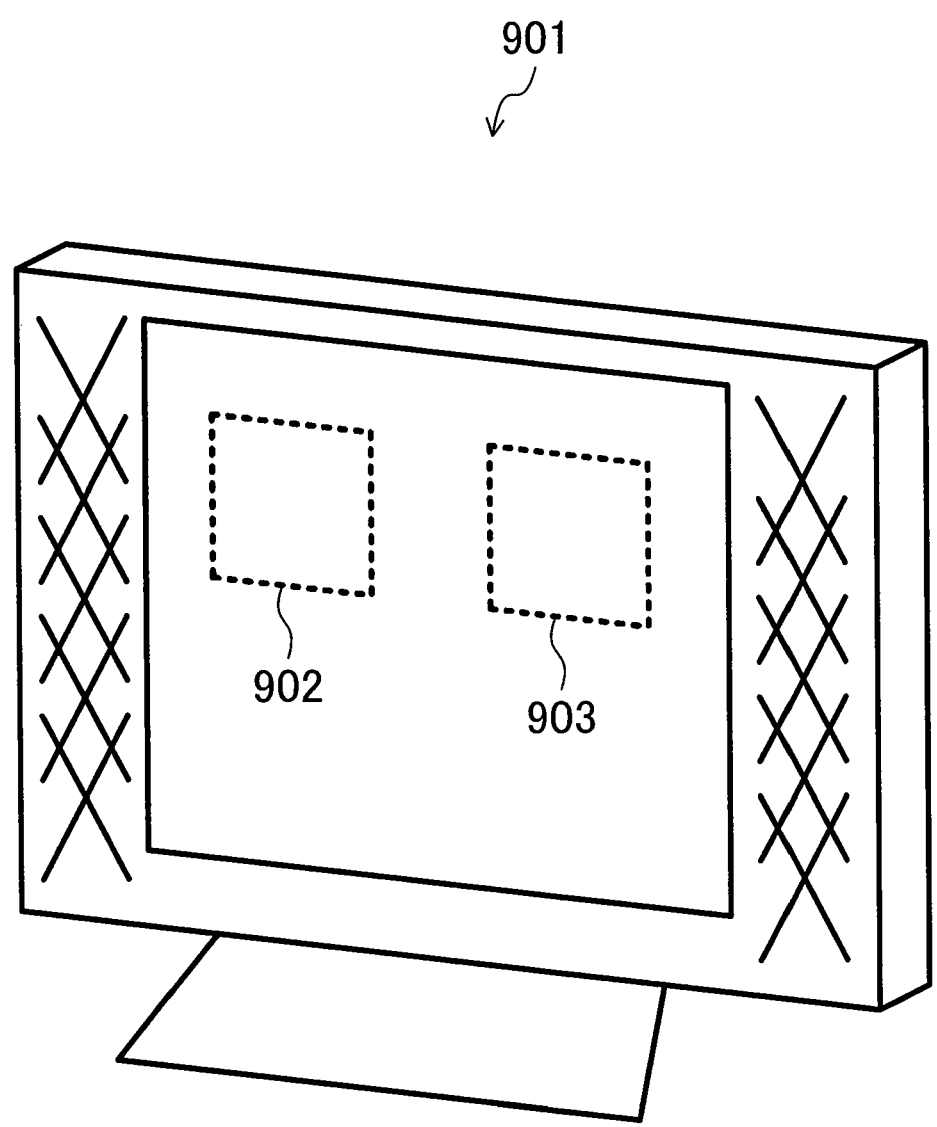
FIG. 13 is a view showing the outline of a TV receiver 901 as an example of image display apparatus having the semiconductor integrated circuit of the present invention.
Figure 14:
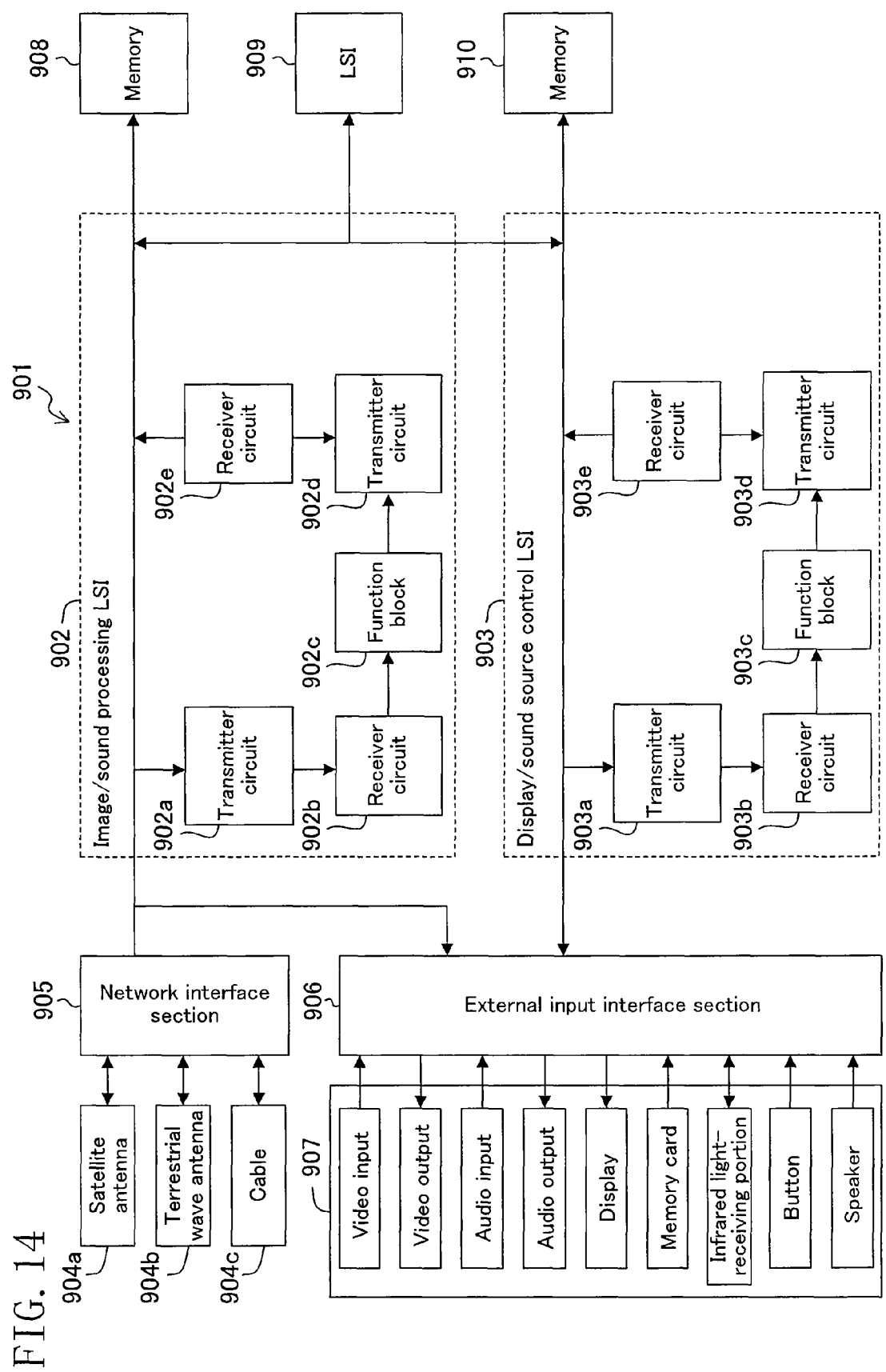
FIG. 14 is a block diagram of the TV receiver 901.

FIG. 13 is a view showing the outline of a TV receiver 901 as an example of image display apparatus having the semiconductor integrated circuit of the present invention. FIG. 14 is a block diagram of the TV receiver 901.

As shown in FIG. 14, the TV receiver 901 includes an image/sound processing LSI 902, a display/sound source control LSI 903, a satellite antenna 904a, a terrestrial wave antenna 904a, a cable 904c, a network interface section 905, an external input interface section 906, a function section 907, a memory 908, an LSI 909 and a memory 910.

The image/sound processing LSI 902, which has a circuit block of basic components for processing of images/sound, processes a video signal and an audio signal. Specifically, the image/sound processing LSI 902 includes a transmitter circuit 902a, a receiver circuit 902b, a function block 902c, a transmitter circuit 902d and a receiver circuit 902e. The transmitter circuits 902a and 902d are any of the transmitter circuits described in Embodiments 1 to 4, and the receiver circuits 902b and 902e are any of the receiver circuits described in Embodiments 1 to 4. The transmitter circuit 902a receives a signal from outside the image/sound processing LSI 902, the receiver circuit 902b receives data from the transmitter circuit 902a, the function block 902c receives data from the receiver circuit 902b, the transmitter circuit 902d receives data from the function block 902c, and the receiver circuit 902e receives data from the transmitter circuit 902d.

The display/sound source LSI 903, which has a circuit block of components for control of a display and a sound source, controls devices such as a display screen and a speaker. Specifically, the display/sound source control LSI 903 includes a transmitter circuit 903a, a receiver circuit 903b, a function block 903c, a transmitter circuit 903d and a receiver circuit 903e. The transmitter circuits 903a and 903d are any of the transmitter circuits described in Embodiments 1 to 4, and the receiver circuits 903b and 903e are any of the receiver circuits described in Embodiments 1 to 4. In other words, the display/sound source control LSI 903 is a semiconductor integrated circuit having the semiconductor integrated circuit of the present invention. The transmitter circuit 903a receives a signal from outside the display/sound source control LSI 903, the receiver circuit 903b receives data from the transmitter circuit 903a, the function block 903c receives data from the receiver circuit 903b, the transmitter circuit 903d receives data from the function block 903c, and the receiver circuit 903e receives data from the transmitter circuit 903d.

The network interface section 905 outputs a video signal and an audio signal inputted via the satellite antenna 904a, the terrestrial wave antenna 904b or the cable 904c to the image/sound processing LSI 902. The external input interface section 906 mediates communication between the function section 907 and the image/sound processing LSI 902 and between the function section 907 and the display/sound source control LSI 903.

The function section 907, which includes a video input portion, a video output portion, an audio input portion, an audio output portion, the display, a memory card, an infrared light-receiving portion, a button and the speaker, performs input/output of a video signal and an audio signal, display of data on the display, data input/output from/to the memory card, acceptance of various instructions and information from the user via the infrared light-receiving portion and the button, and playback of an audio signal via the speaker. The memories 908 and 910 are respectively used by the image/sound processing LSI 902 and the display/sound source control LSI 903. The LSI 909 performs processing of the outputs of the image/sound processing LSI 902 and the display/sound source control LSI 903 and the like, for example.

With the above configuration, in the TV receiver 901 (image display apparatus), the image/sound processing LSI 902 and the display/sound source control LSI 903 are allowed to execute high-speed communication between the outside and an inner function block of each LSI and between function blocks inside each LSI.

It should be noted that FIG. 14 is given to show an example of the relationship between the present invention and an image display apparatus. The functions of the TV receiver 901 are not limited to the illustrated ones, but addition of any function and change of the configuration may be made as long as no problem occurs in the system. Also, the functions of the LSIs can be freely changed as long as integration can be done.

The image display apparatus having the semiconductor integrated circuit of the present invention should not be limited to the TV receiver but also include an apparatus for displaying streaming data distributed via a telecommunication line, for example. In other words, according to the present invention, communication between the outside and an inner function block of an LSI and communication between function blocks in an LSI can be executed at high speed in any image display apparatus irrespective of the information transmission scheme.

(Application 4)

Figure 15:
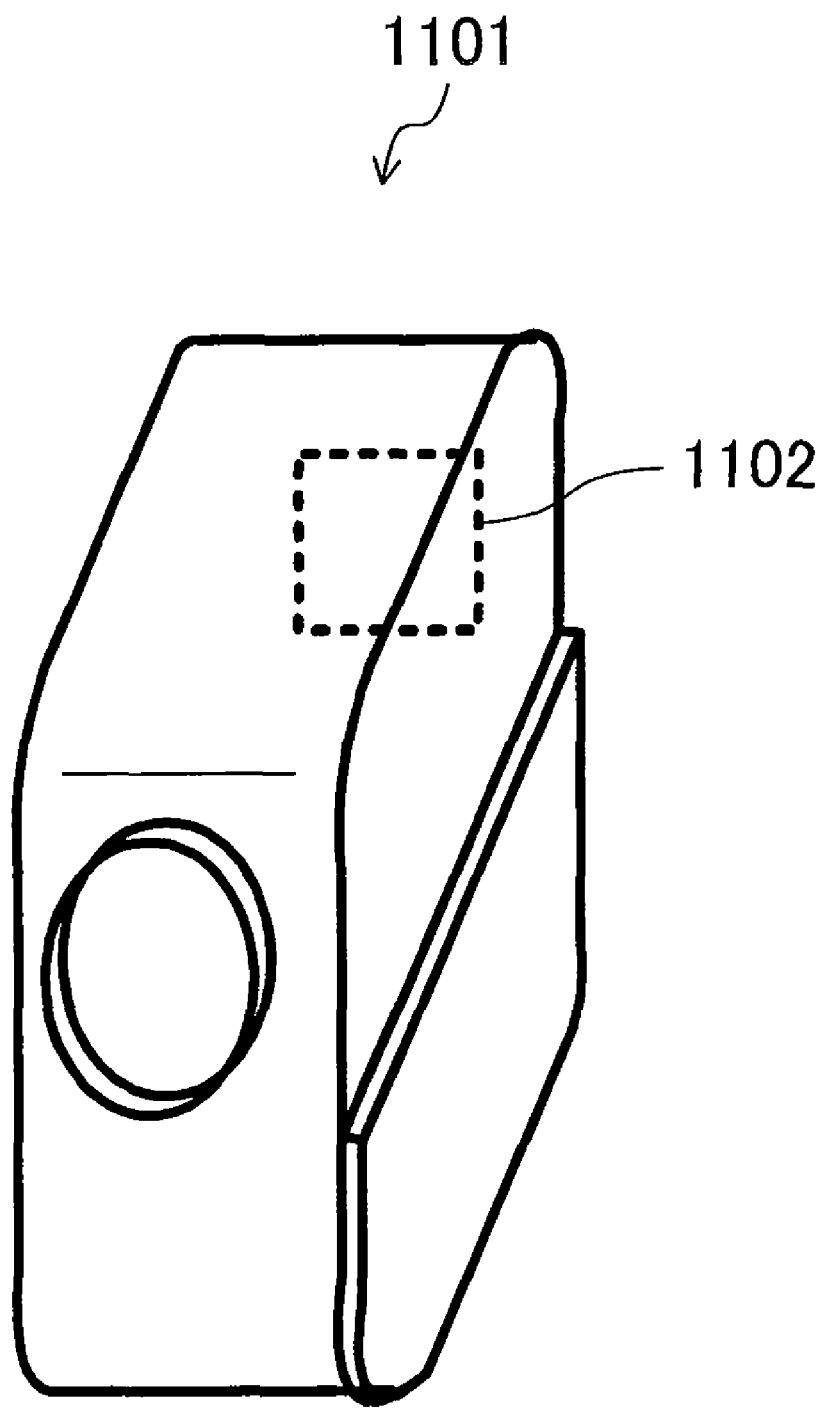
FIG. 15 is a view showing the outline of a digital camera 1101 as an example of electronic apparatus having the semiconductor integrated circuit of the present invention.
Figure 16:
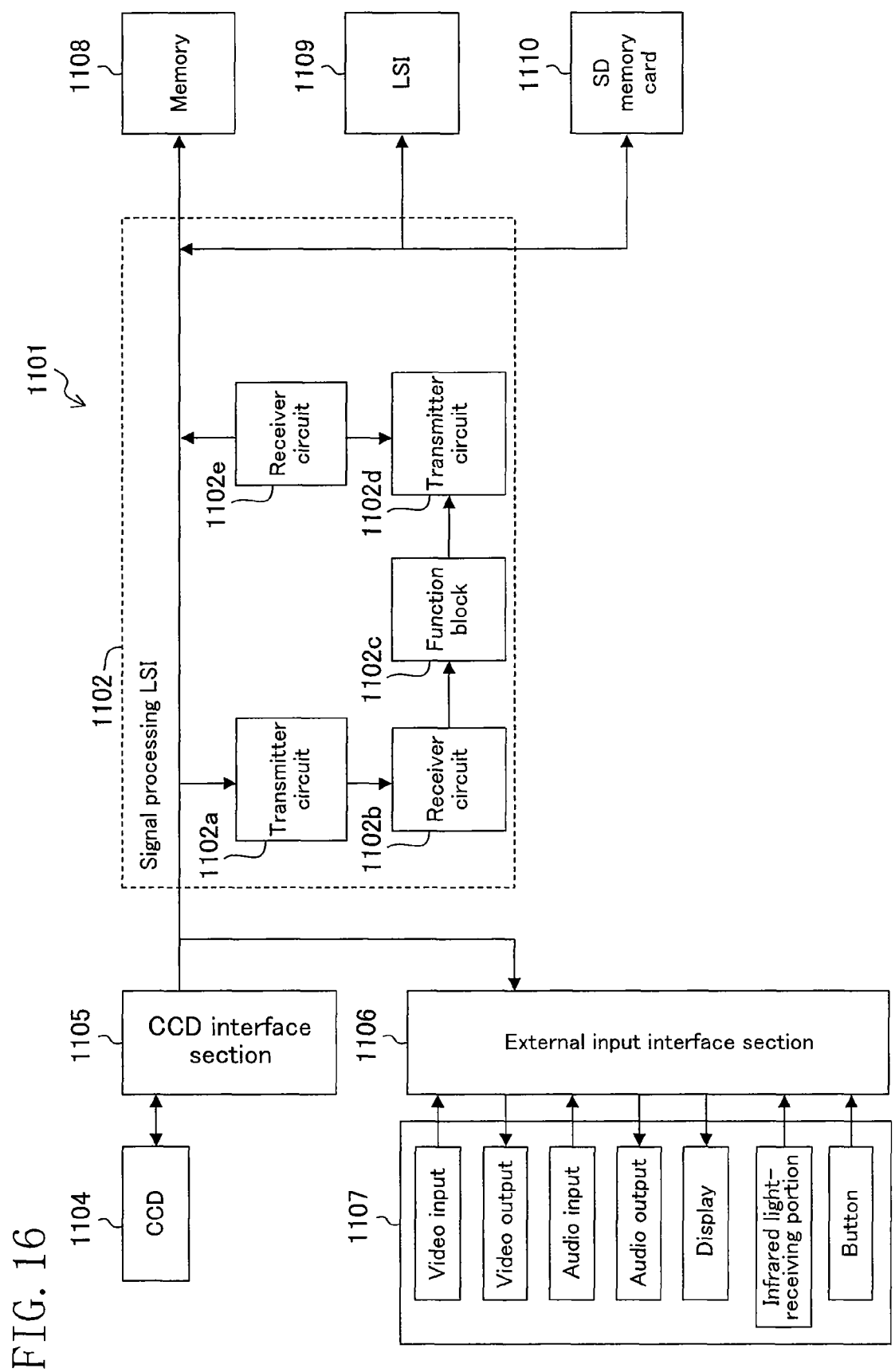
FIG. 16 is a block diagram of the digital camera 1101.

FIG. 15 is a view showing the outline of a digital camera 1101 as an example of electronic apparatus having the semiconductor integrated circuit of the present invention. FIG. 16 is a block diagram of the digital camera 1101.

As shown in FIG. 16, the digital camera 1101 includes a signal processing LSI 1102, a charge coupled device (CCD) 1104, a CCD interface section 1105, an external input interface section 1106, a function section 1107, a memory 1108, an LSI 1109 and a memory card 1110.

The signal processing LSI 1102 is a semiconductor integrated circuit having the semiconductor integrated circuit of the present invention. Specifically, the signal processing LSI 1102 includes a transmitter circuit 1102a, a receiver circuit 1102b, a function block 1102c, a transmitter circuit 1102d and a receiver circuit 1102e. The transmitter circuits 1102a and 1102d are any of the transmitter circuits described in Embodiments 1 to 4, and the receiver circuits 1102b and 1102e are any of the receiver circuits described in Embodiments 1 to 4. The transmitter circuit 1102a receives a signal from outside the signal processing LSI 1102, the receiver circuit 1102b receives data from the transmitter circuit 1102a, the function block 1102c receives data from the receiver circuit 1102b, the transmitter circuit 1102d receives data from the function block 1102c, and the receiver circuit 1102e receives data from the transmitter circuit 1102d.

The CCD 1104 outputs an image of an object formed on a lens (not shown) as a video signal. In place of the CCD 1104, other types of imaging devices may be adopted. The CCD interface section 1105 mediates signal exchange between the CCD 1104 and the signal processing LSI 1102. The external input interface section 1106 mediates communication between the function section 1107 and the signal processing LSI 1102.

The function section 1107, which includes a video input portion, a video output portion, an audio input portion, an audio output portion, a display, an infrared light-receiving portion and a button, performs input/output of a video signal and an audio signal, display of data on the display, and acceptance of various instructions and information from the user via the infrared light-receiving portion and the button. The memory 1108 is used by the signal processing LSI 1102. The LSI 1109 performs processing of the output of the signal processing LSI 1102 and the like, for example. The memory card 1110 is a removable recording medium, in which an audio signal, a video signal of a captured image and the like, for example, are stored.

With the above configuration, in the digital camera 1101 (electronic apparatus), the signal processing LSI 1102 is allowed to execute high-speed communication between the outside and an inner function block of the LSI and between function blocks inside the LSI.

It should be noted that FIG. 16 is given to show an example of the relationship between the present invention and an electronic apparatus. The functions of the digital camera 1101 are not limited to the illustrated ones, but addition of any function and change of the configuration may be made as long as no problem occurs in the system. Also, the functions of the LSI can be freely changed as long as integration can be done.

The electronic apparatus having the semiconductor integrated circuit of the present invention should not be limited to the digital camera, but generally include all apparatuses having a semiconductor integrated circuit, such as various types of sensing apparatuses and electronic calculators. According to the present invention, communication between the outside and an inner function block of an LSI and communication between function blocks in an LSI can be executed at high speed in such electronic apparatuses in general.

(Application 5)

Figure 17:
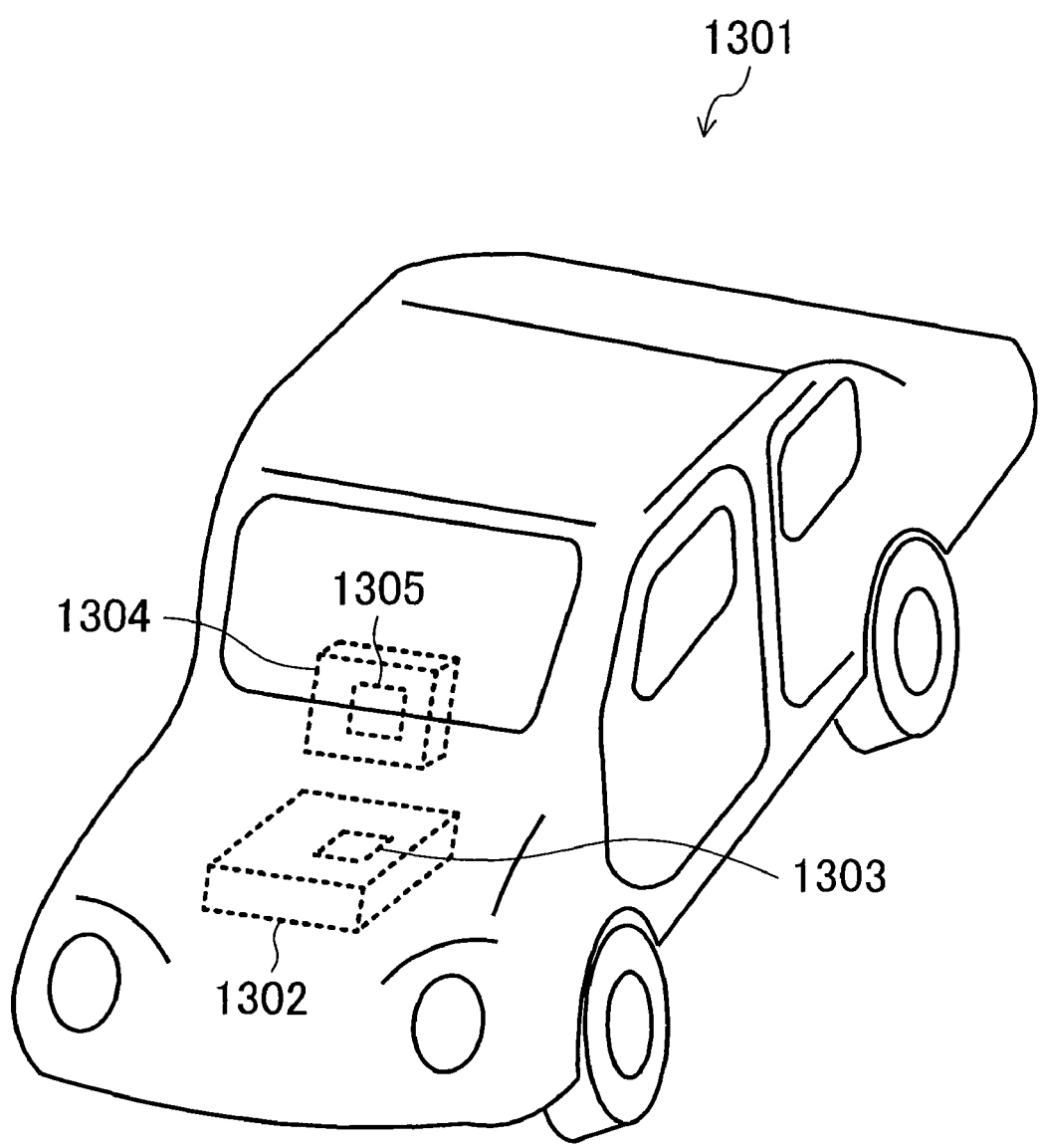
FIG. 17 is a view showing the outline of an automobile 1301 as an example of mobile apparatus having the semiconductor integrated circuit of the present invention.
Figure 18:
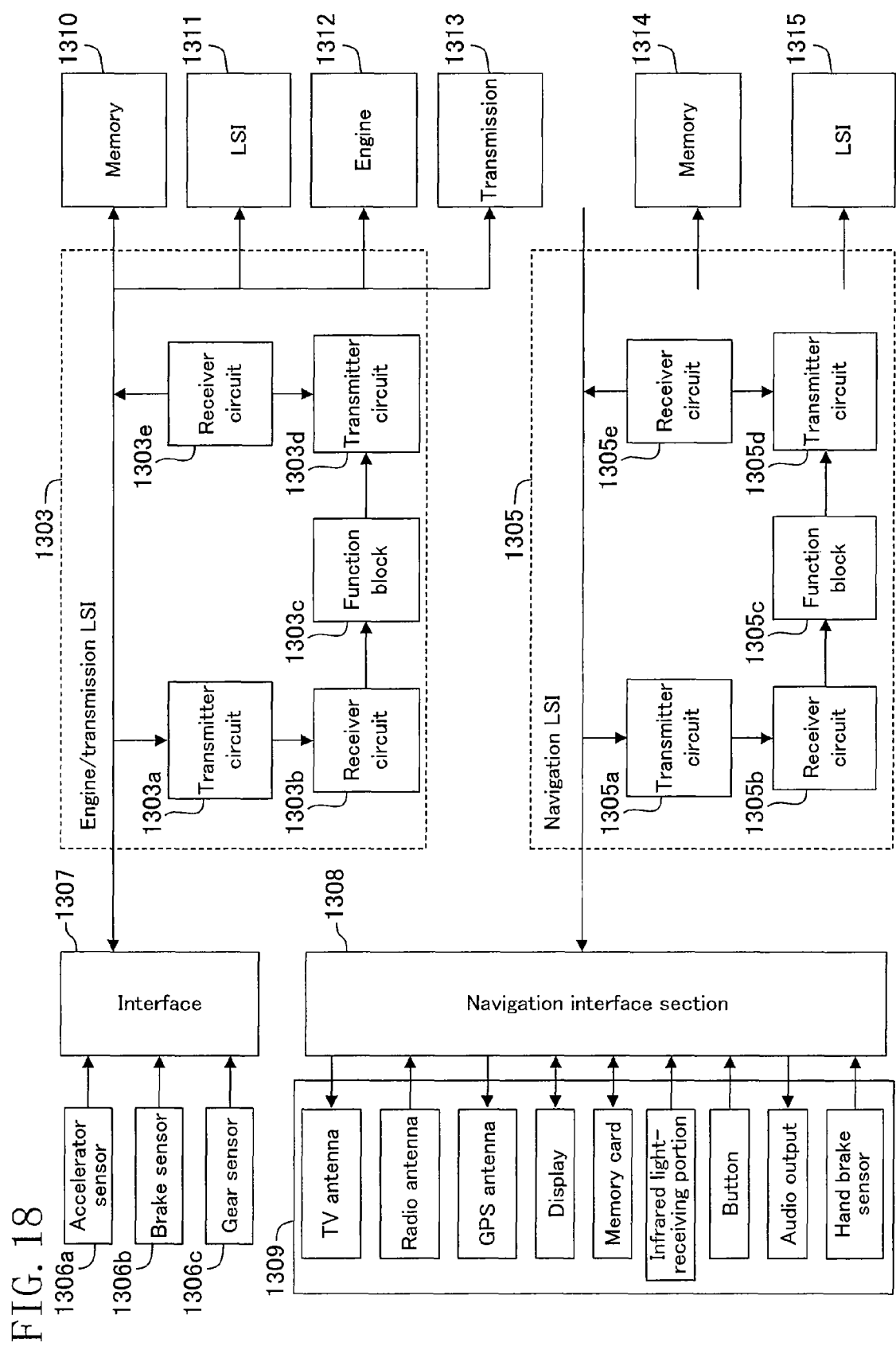
FIG. 18 is a block diagram of an electronic control apparatus 1302 and a navigation apparatus 1304.

FIG. 17 is a view showing the outline of an automobile 1301 as an example of mobile apparatus having the semiconductor integrated circuit of the present invention. The automobile 1301 is equipped with an electronic control apparatus 1302 and a navigation apparatus 1304. The electronic control apparatus 1302 and the navigation apparatus 1304 respectively include an engine/transmission control LSI 1303 and a navigation LSI 1305 both having the semiconductor integrated circuit of the present invention. FIG. 18 is a block diagram of the electronic control apparatus 1302 and the navigation apparatus 1304.

As shown in FIG. 18, the electronic control apparatus 1302 includes the engine/transmission control LSI 1303, an accelerator sensor 1306a, a brake sensor 1306b, a gear sensor 1306c, an interface section 1307, a memory 1310 and an LSI 1311, for controlling an engine 1312 and a transmission 1313 of the automobile 1301.

The engine/transmission control LSI 1303 has a circuit block of components for engine/transmission control in this apparatus. Specifically, the engine/transmission control LSI 1303 includes a transmitter circuit 1303a, a receiver circuit 1303b, a function block 1303c, a transmitter circuit 1303d and a receiver circuit 1303e. The transmitter circuits 1303a and 1303d are any of the transmitter circuits described in Embodiments 1 to 4, and the receiver circuits 1303b and 1303e are any of the receiver circuits described in Embodiments 1 to 4. In other words, the engine/transmission control LSI 1303 is a semiconductor integrated circuit having the semiconductor integrated circuit of the present invention. The transmitter circuit 1303a receives a signal from outside the engine/transmission control LSI 1303, the receiver circuit 1303b receives data from the transmitter circuit 1303a, the function block 1303c receives data from the receiver circuit 1303b, the transmitter circuit 1303d receives data from the function block 1303c, and the receiver circuit 1303e receives data from the transmitter circuit 1303d.

The interface section 1307 mediates data input/output between the engine/transmission control LSI 1303 and each of the accelerator sensor 1306a, the brake sensor 1306b and the gear sensor 1306c. The memory 1310 is used by the engine/transmission control LSI 1303. The LSI 1311 performs processing of the output of the engine/transmission control LSI 1303 and the like, for example.

Also, as shown in FIG. 18, the navigation apparatus 1304 includes a navigation LSI 1305, a navigation interface section 1308, a function section 1309, a memory 1314 and an LSI 1315.

The navigation LSI 1305 has a circuit block for navigation processing in this apparatus. Specifically, the navigation LSI 1305 includes a transmitter circuit 1305a, a receiver circuit 1305b, a function block 1305c, a transmitter circuit 1305d and a receiver circuit 1305e. The transmitter circuits 1305a and 1305d are any of the transmitter circuits described in Embodiments 1 to 4, and the receiver circuits 1305b and 1305e are any of the receiver circuits described in Embodiments 1 to 4. In other words, the navigation LSI 1305 is a semiconductor integrated circuit having the semiconductor integrated circuit of the present invention. The transmitter circuit 1305a receives a signal from outside the navigation LSI 1305, the receiver circuit 1305b receives data from the transmitter circuit 1305a, the function block 1305c receives data from the receiver circuit 1305b, the transmitter circuit 1305d receives data from the function block 1305c, and the receiver circuit 1305e receives data from the transmitter circuit 1305d.

The navigation interface section 1308 mediates signal exchange between the function section 1309 and the navigation LSI 1305. The function section 1309, which includes a TV antenna, a radio antenna, a global positioning system (GPS) antenna, a display, a memory card, an infrared light-receiving portion, a button, an audio output section and a hand brake sensor, performs reception of a TV broadcast, a radio broadcast and a GPS signal, display of data on the display, data input/output from/to the memory card, acceptance of various instructions and information from the user via the infrared light-receiving portion and the button, output of an audio signal, detection of the state of the hand brake and the like. The memory 1314 is used by the navigation LSI 1305. The LSI 1315 performs processing of the output of the navigation LSI 1305 and the like, for example.

With the configuration described above, the engine/transmission control SLI 1303 and the navigation LSI 1305 are allowed to execute high-speed communication between the outside and an inner function block of each LSI and between function blocks inside each LSI.

It should be noted that FIG. 18 is given to show an example of the relationship between the present invention and the electronic control apparatus and the mobile apparatus equipped with the electronic control apparatus. The functions of the automobile 1301, the electronic control apparatus 1302 and the navigation apparatus 1304 are not limited to the illustrated ones, but addition of any function and change of the configuration may be made as long as no problem occurs in the system. Also, the functions of the LSIs can be freely changed as long as integration can be done.

The electronic control apparatus having the semiconductor integrated circuit of the present invention should not be limited to that for controlling the engine and the transmission described above, but generally include all apparatuses having a semiconductor integrated circuit that control a power source, such as a motor control apparatus, for example. According to the present invention, such an electronic control apparatus can obtain the effect that communication between the outside and an inner function block of an LSI and communication between function blocks inside an LSI are executed at high speed.

The mobile apparatus having the semiconductor integrated circuit of the present invention should not be limited to the automobile, but generally include all apparatuses having an electronic control apparatus for controlling an engine, a motor and the like as the power source, such as a train and an airplane, for example. According to the present invention, such a mobile apparatus can obtain the effect that communication between the outside and an inner function block of an LSI and communication between function blocks inside an LSI are executed at high speed.

Embodiment 6

Figure 19:
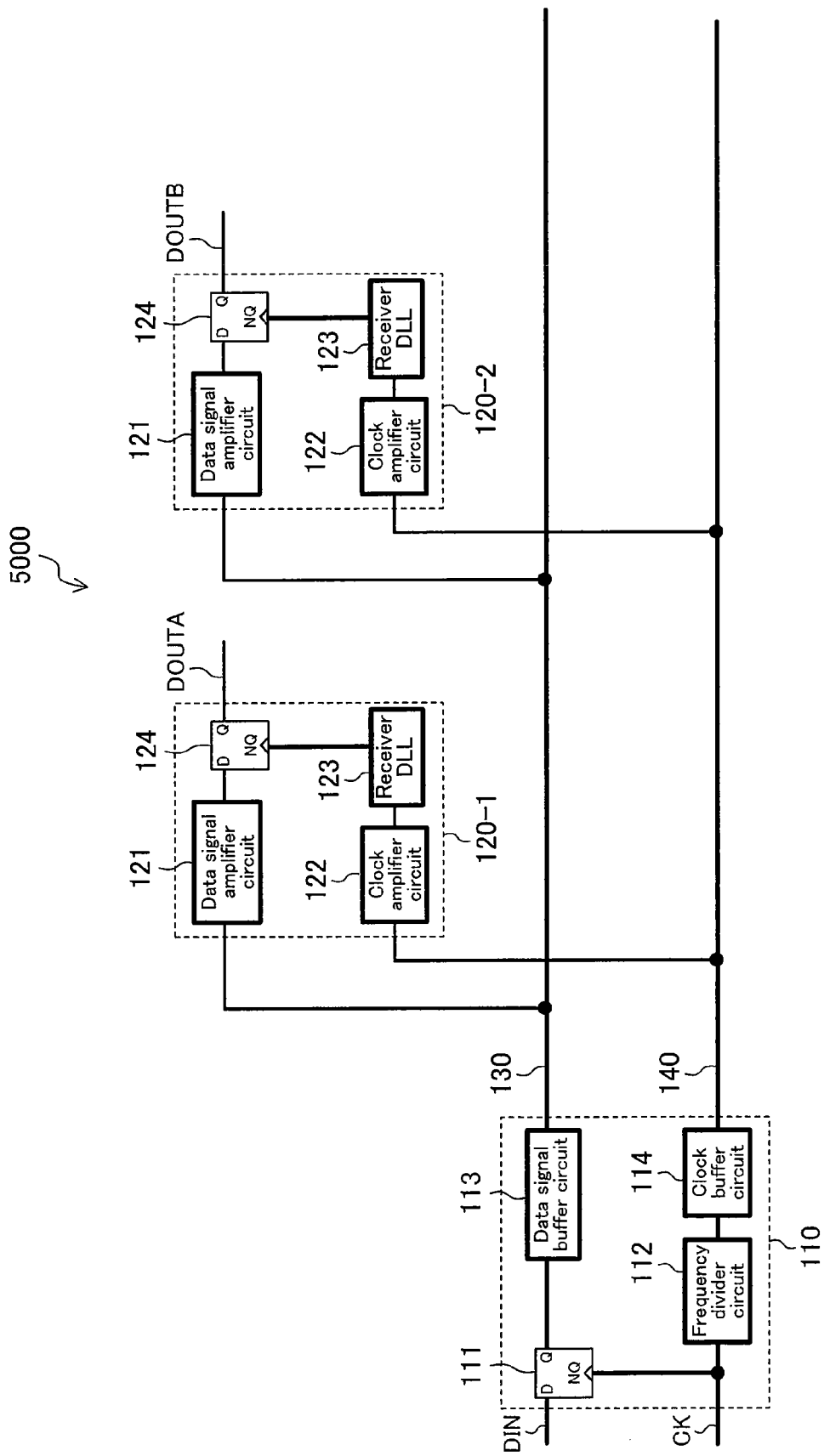
FIG. 19 is a block diagram of a semiconductor integrated circuit 5000 of Embodiment 6.

FIG. 19 is a block diagram of a semiconductor integrated circuit 5000 of Embodiment 6 of the present invention. As shown in FIG. 19, the semiconductor integrated circuit 5000 includes a transmitter circuit 110, two receiver circuits 120, a data signal transmission line 130 and a clock transmission line 140. That is, the semiconductor integrated circuit 5000 of this embodiment is different from the semiconductor integrated circuit 100 of Embodiment 1 in having two receiver circuits. In FIG. 19 and in the following description, the two receiver circuits 120 are distinguished from each other by adding suffixes to the reference numeral like 120-1 and 120-2.

In this embodiment, the external data signal DIN inputted into the transmitter circuit 110 refers to a signal transmitted from a circuit other than the transmitter circuit 110 and the like. In other words, the external data signal DIN may be a signal transmitted from outside the semiconductor integrated circuit 5000 or a signal transmitted from a circuit other than the transmitter circuit 110 inside the semiconductor integrate circuit 5000.

In this embodiment, the receiver circuits 120-1 and 120-2, both of which are connected with the transmitter circuit 110 via the data signal transmission line 130 and the clock signal transmission line 140, receive the external data signal DIN transmitted from the transmitter circuit 110 and output an output data signal. The output data signals outputted from the receiver circuits 120-1 and 120-2 are denoted by DOUTA and DOUTB.

With the configuration described above, data can be transmitted from one transmitter circuit to a plurality of receiver circuits physically separated from each other. Moreover, since the wiring region and the transmitter circuit region can be shared, the chip area can be reduced.

Although two receiver circuits were provided in this embodiment, substantially the same effect can also be obtained when more than two receiver circuits are provided.

Embodiment 7

Figure 20:
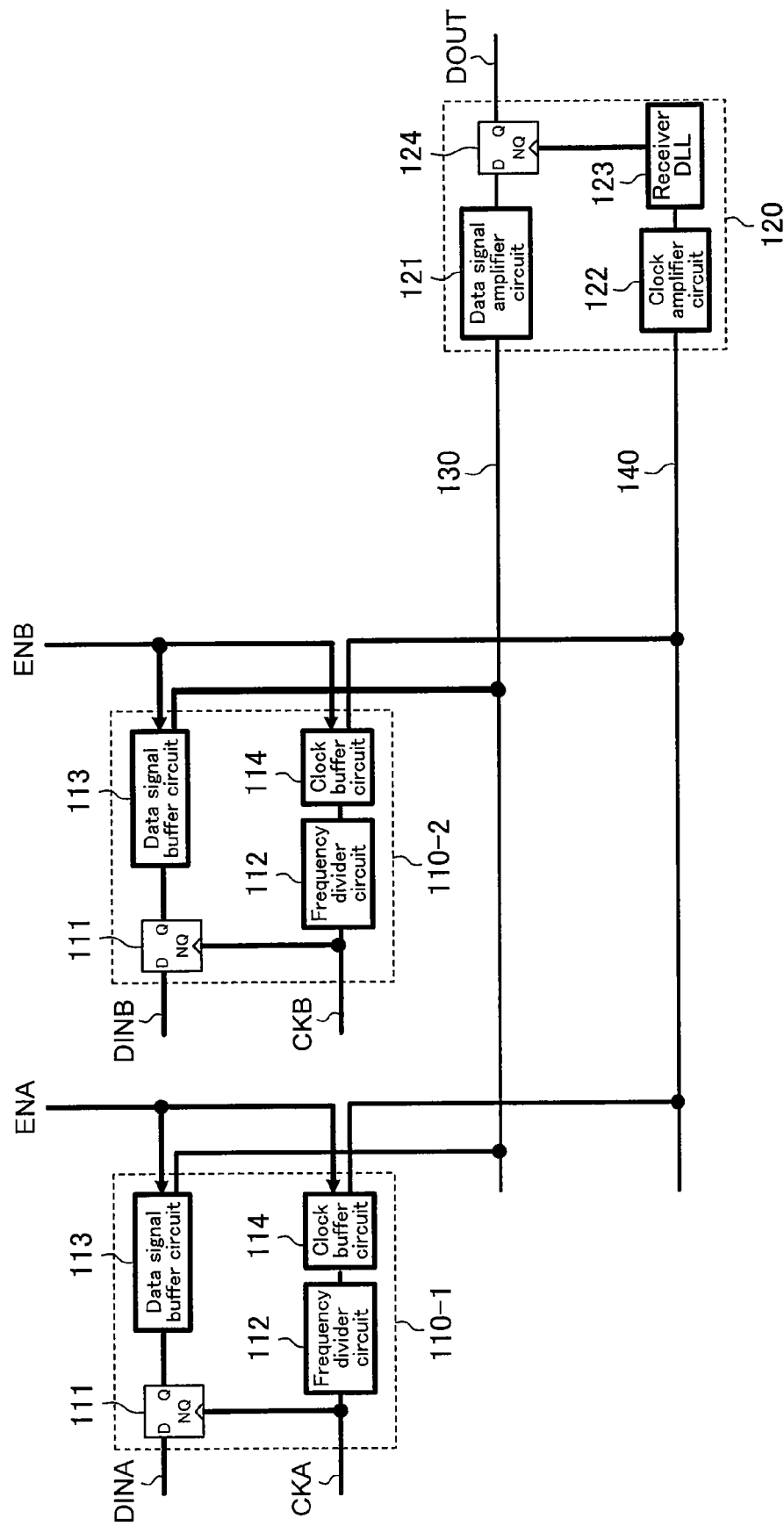
FIG. 20 is a block diagram of a semiconductor integrated circuit 5100 of Embodiment 7.

FIG. 20 is a block diagram of a semiconductor integrated circuit 5100 of Embodiment 7 of the present invention. As shown in FIG. 20, the semiconductor integrated circuit 5100 includes two transmitter circuits 110, a receiver circuit 120, a data signal transmission line 130 and a clock transmission line 140. That is, the semiconductor integrated circuit 5100 of this embodiment is different from the semiconductor integrated circuit 100 of Embodiment 1 in that two transmitter circuits 110 are provided and that the transmitter circuits 110 are partly changed from the transmitter circuit in Embodiment 1. In FIG. 20 and in the following description, the two transmitter circuits 110 are distinguished from each other by adding suffixes to the reference numeral like 110-1 and 110-2.

In each of the transmitter circuits 110, the data signal buffer circuit 113 is different from that in Embodiment 1. Specifically, the data signal buffer circuit 113 newly has a tri-state buffer function for controlling ON/OFF of its output according to an inputted control signal. Herein, the control signals inputted into the transmitter circuits 110-1 and 110-2 are respectively denoted by ENA and ENB. Also, the clock signals inputted into the transmitter circuits 110-1 and 110-2 are respectively denoted by CKA and CKB.

In this embodiment, as in Embodiment 1, the external data signal inputted into the transmitter circuit 110 refers to a signal transmitted from a circuit other than the transmitter circuit 110 and the like. In other words, the external data signal may be a signal transmitted from outside the semiconductor integrated circuit 5100 or a signal transmitted from a circuit other than the transmitter circuit 110 inside the semiconductor integrated circuit 5100. Herein, the external data signals inputted into the transmitter circuits 110-1 and 110-2 are respectively denoted by DINA and DINB.

The receiver circuit 120, which is connected with the transmitter circuits 110-1 and 110-2 via the data signal transmission line 130 and the clock signal transmission line 140, receives the external data signal DINA transmitted from the transmitter circuit 110-1 or the external data signal DINB transmitted from the transmitter circuit 110-2, and outputs an output data signal DOUT.

Whether the receiver circuit 120 receives the data from the transmitter circuit 110-1 or the data from the transmitter circuit 110-2 is controlled with the control signal ENA inputted into the data signal buffer circuit 113 of the transmitter circuit 110-1 and the control signal ENB inputted into the data signal buffer circuit 113 of the transmitter circuit 110-2.

Either one of the control signals ENA and ENB is turned ON at a time, to avoid collision of buses. Arbitration on which signal, the control signal ENA or the control signal ENB, should be turned ON, may be made by various methods including those based on fixed priorities, priorities determined by the round-robin style, and dynamically determined priorities. Otherwise, this arbitration may be made by a method prepared from the signal states of the clock signals CKA and CKB.

With the configuration described above, data can be transmitted from a plurality of transmitter circuits physically separated from each other to one receiver circuit. Moreover, since the wiring region and the transmitter circuit region can be shared, the chip area can be reduced.

Although two transmitter circuits were provided in this embodiment, substantially the same effect can also be obtained when more than two transmitter circuits are provided.

Embodiment 8

Figure 21:
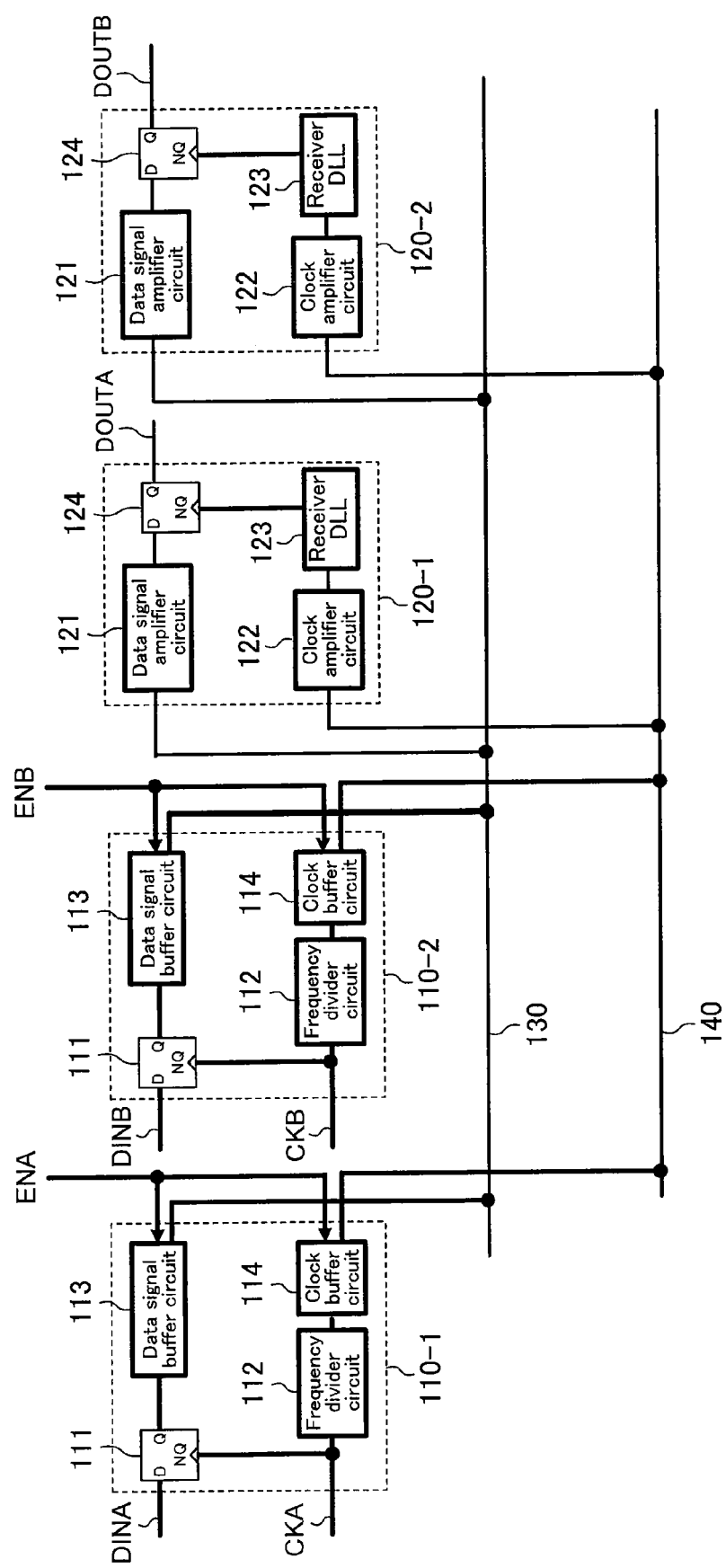
FIG. 21 is a block diagram of a semiconductor integrated circuit 5200 of Embodiment 8.

FIG. 21 is a block diagram of a semiconductor integrated circuit 5200 of Embodiment 8 of the present invention. The semiconductor integrated circuit 5200 has one receiver circuit 120 in addition to the configuration of the semiconductor integrated circuit of Embodiment 7. That is, as shown in FIG. 21, the semiconductor integrated circuit 5200 includes two transmitter circuits 110 and two receiver circuits 120, which are connected via a data signal transmission line 130 and a clock transmission line 140. In this embodiment, as in Embodiment 7, a plurality of same components are distinguished from each other by adding suffixes to the reference numeral. The output data signals outputted from the receiver circuits 120-1 and 120-2 are respectively denoted by DOUTA and DOUTB.

With the above configuration, the receiver circuits 120-1 and 120-2 receive the external data signal transmitted from either one of the transmitter circuits 110-1 and 110-2 according to the control signals ENA and ENB. In other words, in this embodiment, data can be transmitted from a plurality of physically separated transmitter circuits to a plurality of physically separated transmitter circuits. Moreover, since the wiring region and the transmitter circuit region can be shared, the chip area can be reduced.

Although each two of receiver circuits and transmitter circuits were provided in this embodiment, substantially the same effect can also be obtained when more than two receiver circuits and more than two transmitter circuits are provided.

Other Embodiments

In the above embodiments, the data signal transmission line 130 and the clock transmission line 140 desirably run in parallel with each other. The transmission lines running in parallel are substantially the same in delay time, and this makes it easy to latch synchronous data in the receiver FF circuit.

In the above embodiments, the amplifier circuits were provided individually. Alternatively, they may be provided as part of the flipflop circuit, like a sense amplifier flip-flop.

In the above embodiments, the flipflops updated the value every rising edge. Alternatively, a flipflop that updates the value every falling edge or a flipflop that updates the value every rising and falling edges may be used.

Although the 3-tap preemphasis circuit was described in Embodiment 4, the number of taps can be increased or decreased depending on the transmission rate.

As described above, the semiconductor integrated circuit of the present invention has the effect of permitting transmission at a transfer rate higher than the conventional one with a transmission line having the same structure as the conventional one, and thus is useful as a semiconductor integrated circuit for transmitting a data signal at high transfer rate from a transmitter-side core to a receiver-side core inside a fine-process adopted LSI.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A semiconductor integrated circuit comprising:
   a transmitter circuit for transmitting a supplied external data signal, the transmitter circuit comprising:
      a transmitter flipflop circuit having a reference clock as an input for holding the external data signal in synchronization with the reference clock;
      a frequency divider circuit for multiplying the frequency of the reference clock by n/m, where m and n are integers equal to or more than 2 and m>n;
      a data signal buffer circuit for transmitting a data signal held by the transmitter flipflop circuit; and
      a clock buffer circuit for transmitting the output of the frequency divider circuit;
   a receiver circuit for receiving the external data signal transmitted from the transmitter circuit;
   a data signal transmission line; and
   a clock transmission line, wherein:
   the receiver circuit comprises:
      a data signal amplifier circuit for amplifying the external data signal;
      a clock amplifier circuit having a reference clock as an input for amplifying the reference clock;
      a receiver DLL circuit for multiplying the frequency of the output of the clock amplifier circuit by m/n; and
      a receiver flipflop circuit for holding the output of the data signal amplifier circuit in synchronization with the output of the receiver DLL circuit,
   the data signal transmission line transmits the output of the data signal buffer circuit to the data signal amplifier circuit,
   the clock transmission line transmits the output of the clock buffer circuit to the clock amplifier circuit, and
   the data signal transmission line and the clock transmission line run in parallel with each other.

2. A semiconductor integrated circuit having a receiver circuit for receiving an external data signal, wherein:
   the receiver circuit comprises:
      a data signal amplifier circuit for amplifying the external data signal;
      a clock amplifier circuit having a reference clock as an input for amplifying the reference clock;
      a receiver DLL circuit for multiplying the frequency of the output of the clock amplifier circuit by m/n, where m and n are integers equal to or more than 2 and m>n, and
      a receiver flipflop circuit for holding the output of the data signal amplifier circuit in synchronization with the output of the receiver DLL circuit,
   the receiver DLL circuit comprises:
      a variable delay circuit for delaying the output of the clock amplifier circuit and outputting the delayed signal;
      a phase comparator circuit for comparing the phase of the output of the clock amplifier circuit with the phase of the output of the variable delay circuit;
      an up/down counter for adjusting the delay time of the output signal of the variable delay circuit according to the comparison result from the phase comparator circuit; and
      a multiplier circuit,
   the variable delay circuit outputs a total of 2m signals including a signal having the same phase as the output of the clock amplifier circuit and 2m−1 signals different in phase from one another by 180/m degree each, and
   the multiplier circuit outputs a clock having a frequency m/n times as high as the output of the clock amplifier circuit based on the 2m signals.

3. The semiconductor integrated circuit of claim 1, wherein:
   the receiver DLL circuit comprises:
      a variable delay circuit for delaying the output of the clock amplifier circuit and outputting the delayed signal;
      a phase comparator circuit for comparing the phase of the output of the clock amplifier circuit with the phase of the output of the variable delay circuit;
      an up/down counter for adjusting the delay time of the output signal of the variable delay circuit according to the comparison result from the phase comparator circuit; and
      a multiplier circuit,
   the variable delay circuit outputs a total of 2m signals including a signal having the same phase as the output of the clock amplifier circuit and 2m−1 signals different in phase from one another by 180/m degree each, and
   the multiplier circuit outputs a clock having a frequency m/n times as high as the output of the clock amplifier circuit based on the 2m signals.

4. A semiconductor integrated circuit having a transmitter circuit for transmitting a supplied external data signal and a receiver circuit for receiving the signal transmitted from the transmitter circuit, wherein:
   the transmitter circuit comprises:
      a frequency divider circuit for multiplying the frequency of a reference clock by n/m, where m and n are integers equal to or more than 2 and m>n, to produce a transmission clock;
      a transmitter DLL circuit having the transmission clock as an input and outputting a power supply voltage and a ground voltage both having a frequency corresponding to the frequency of the transmission clock;
      a VCO circuit having the transmission clock, the power supply voltage and the ground voltage as inputs and outputting a first clock having the same frequency as the reference clock and a second clock having the same frequency as the transmission clock;
      a transmitter flipflop circuit for holding an external data signal in synchronization with the first clock;
      a data signal buffer circuit for transmitting a data signal held by the transmitter flipflop circuit; and
      a clock buffer circuit for transmitting the second clock,
   the receiver circuit comprises:
      a data signal amplifier circuit for amplifying the data signal transmitted from the data signal buffer circuit:
      a clock amplifier circuit for amplifying the second clock transmitted from the clock buffer circuit:
      a receiver DLL circuit for multiplying the frequency of the second clock amplified by the clock amplifier circuit by m/n; and
      a receiver flipflop circuit for holding the output of the data signal amplifier circuit in synchronization with the clock outputted from the receiver DLL circuit, and the transmitter DLL circuit and the receiver DLL circuit have their phase comparator circuits, up/down counters and variable delay circuits that are respectively the same in configuration.

5. A communication apparatus comprising:
the semiconductor integrated circuit of claim 1;
a high-frequency transmission/reception interface section; and
an external input interface section,
wherein the semiconductor integrated circuit performs signal transmission or reception with at least one of the high-frequency transmission/reception interface section and the external input interface section.

6. An information playback apparatus comprising:
the semiconductor integrated circuit of claim 1;
a tuner section; and
an external input interface section,
wherein the semiconductor integrated circuit performs signal transmission or reception with at least one of the tuner section and the external input interface section.

7. An image display apparatus comprising:
the semiconductor integrated circuit of claim 1;
a network interface section; and
an external input interface section,
wherein the semiconductor integrated circuit performs signal transmission or reception with at least one of the network interface section and the external input interface section.

8. An electronic apparatus comprising:
the semiconductor integrated circuit of claim 1;
a CCD interface section; and
an external input interface section,
wherein the semiconductor integrated circuit performs signal transmission or reception with at least one of the CCD interface section and the external input interface section.

9. An electronic control apparatus comprising:
the semiconductor integrated circuit of claim 1; and
a navigation interface section,
wherein the semiconductor integrated circuit performs signal transmission or reception with the navigation interface section.

10. A mobile apparatus comprising the electronic control apparatus of claim 9.

* * * * *